(12) United States Patent
Kim et al.

(10) Patent No.: US 8,711,016 B2
(45) Date of Patent: Apr. 29, 2014

(54) BINARY-TO-GRAY CONVERTING CIRCUITS AND GRAY CODE COUNTER INCLUDING THE SAME

(71) Applicant: Samsung Electronics Co., Ltd., Hwaseong-si (KR)

(72) Inventors: Kyung-Min Kim, Seoul (KR); Jin-Woo Kim, Seoul (KR); Hee-Sung Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/764,262

(22) Filed: Feb. 11, 2013

(65) Prior Publication Data

US 2013/0278451 A1 Oct. 24, 2013

(30) Foreign Application Priority Data

Apr. 24, 2012 (KR) .......................... 10-2012-0042415

(51) Int. Cl.
*H03M 7/16* (2006.01)
*H03K 23/00* (2006.01)

(52) U.S. Cl.
CPC .............. *H03M 7/16* (2013.01); *H03K 23/005* (2013.01)
USPC ............................................. 341/98; 377/34

(58) Field of Classification Search
CPC ................................. H03M 7/14; H03M 7/16
USPC ............................................. 341/98; 377/34
See application file for complete search history.

(56) References Cited

U.S. PATENT DOCUMENTS

| | | | | | |
|---|---|---|---|---|---|
| 4,618,849 | A | * | 10/1986 | Bruestle | 341/98 |
| 5,097,491 | A | * | 3/1992 | Hall | 377/34 |
| 5,329,280 | A | * | 7/1994 | Amuro | 341/96 |
| 5,459,466 | A | | 10/1995 | Knierim et al. | |
| 7,071,855 | B1 | * | 7/2006 | Sadowsky | 341/98 |
| 2003/0067401 | A1 | | 4/2003 | Yi | |
| 2003/0179848 | A1 | | 9/2003 | Nakamura | |

FOREIGN PATENT DOCUMENTS

| | | |
|---|---|---|
| JP | 2002-111482 | 4/2002 |
| JP | 2003-037504 | 2/2003 |
| JP | 2007-088677 | 4/2007 |
| JP | 2010-220148 | 9/2010 |
| KR | 10-2001-0004570 A | 1/2001 |
| KR | 10-2007-0068803 A | 7/2007 |
| KR | 10-2007-0069288 A | 7/2007 |
| KR | 10-2008-0062056 A | 7/2008 |

* cited by examiner

*Primary Examiner* — Howard Williams
(74) *Attorney, Agent, or Firm* — Myers Bigel Sibley & Sajovec, P.A.

(57) ABSTRACT

A binary-to-Gray converting circuit includes a buffer unit and a conversion unit. The buffer unit generates a data code of n bits in response to a power supply voltage and a second binary bit signal through an $n^{th}$ binary bit signal except for a first binary bit signal corresponding to a least significant bit of a binary code of n bits. The conversion unit generates a Gray code of n bits based on the binary code and the data code, and generates a $k^{th}$ Gray bit signal of the Gray code by latching a $k^{th}$ data bit signal of the data code in response to a $k^{th}$ binary bit signal of the binary code. A logic level of the $k^{th}$ Gray bit signal is determined corresponding to a logic level of the $k^{th}$ data bit signal.

20 Claims, 25 Drawing Sheets

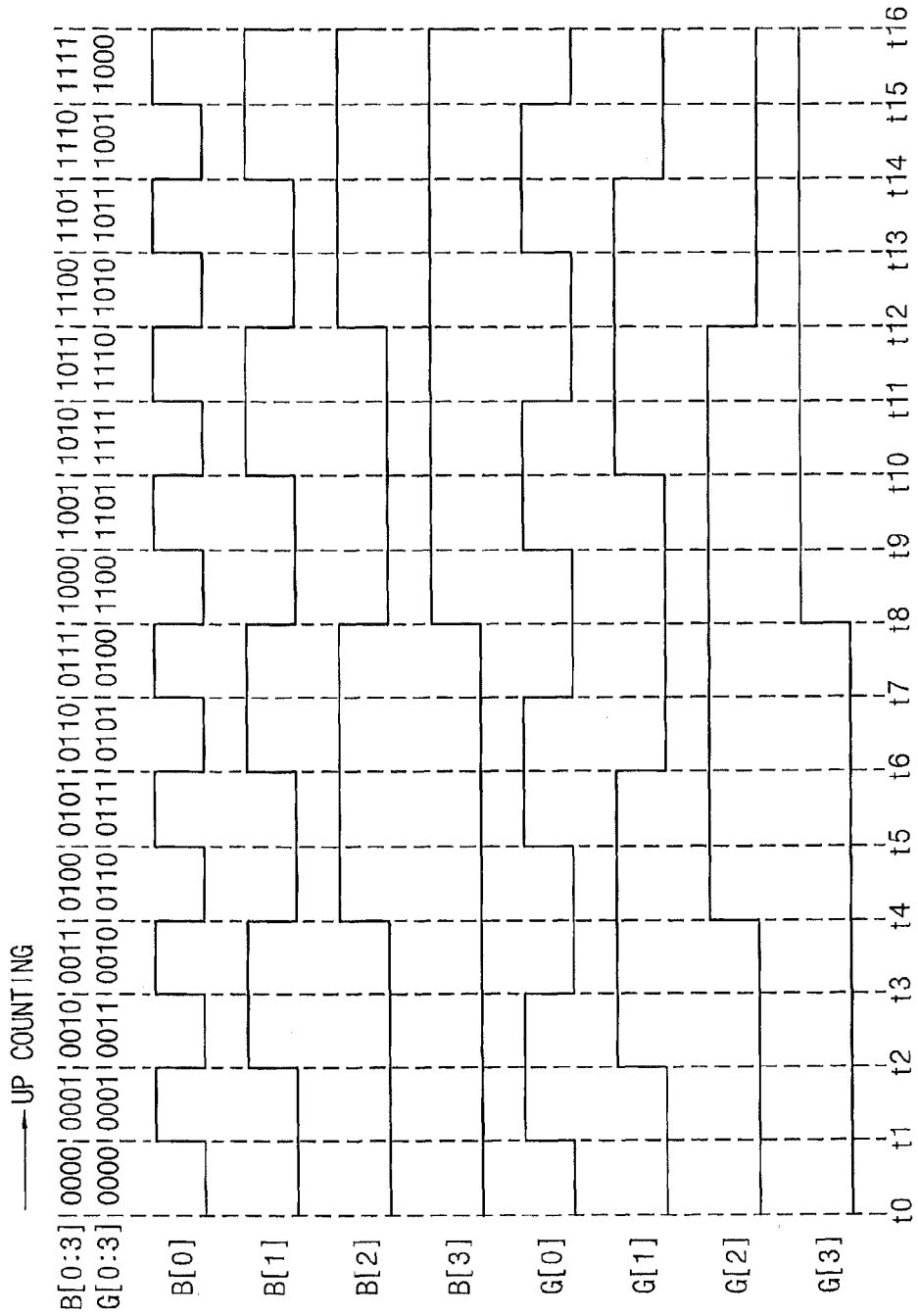

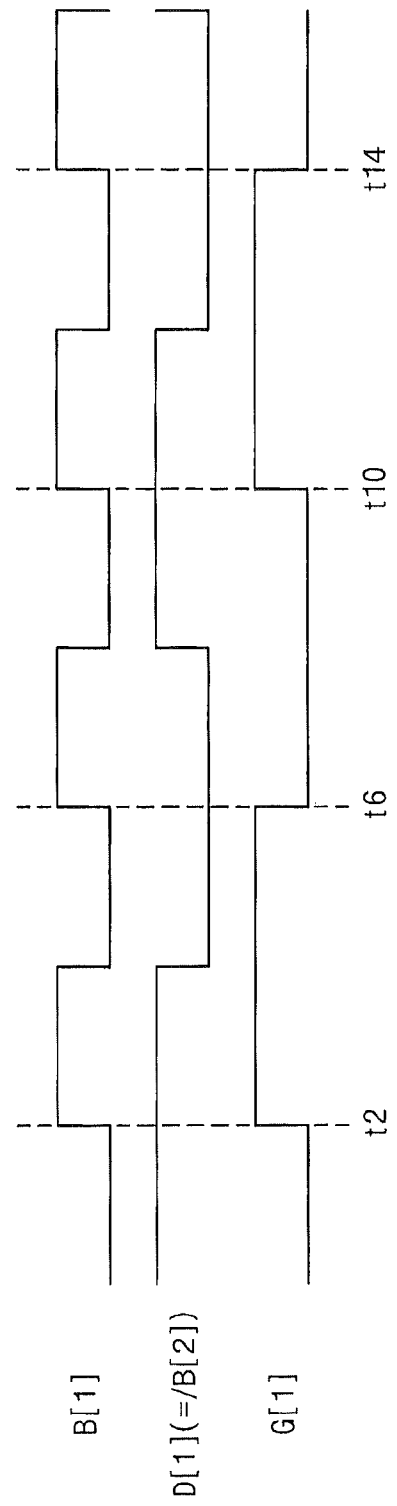

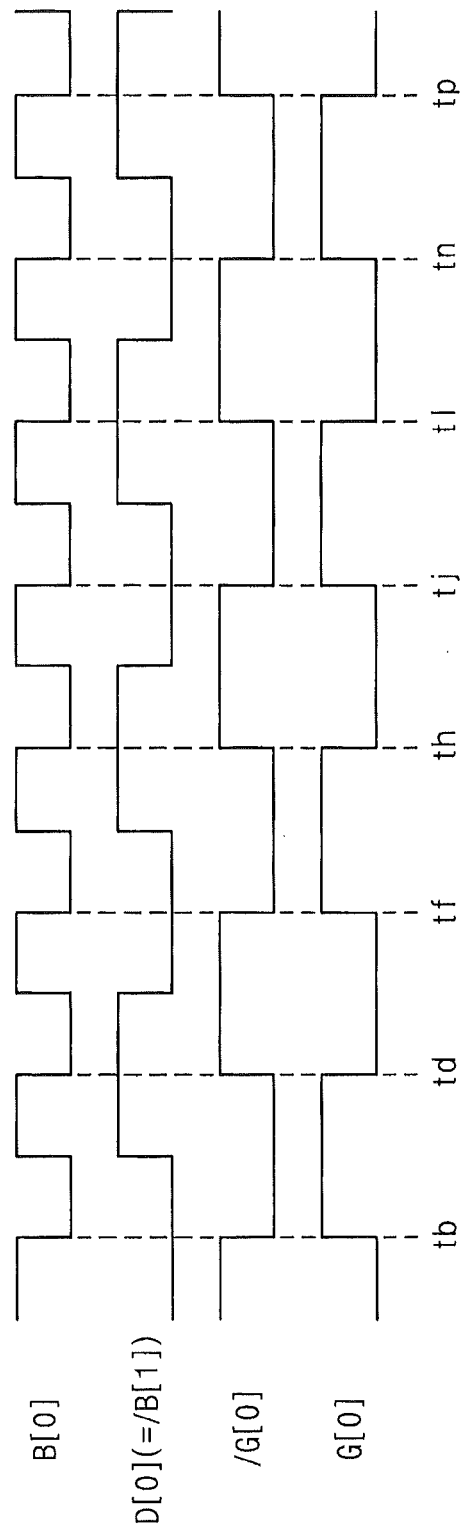

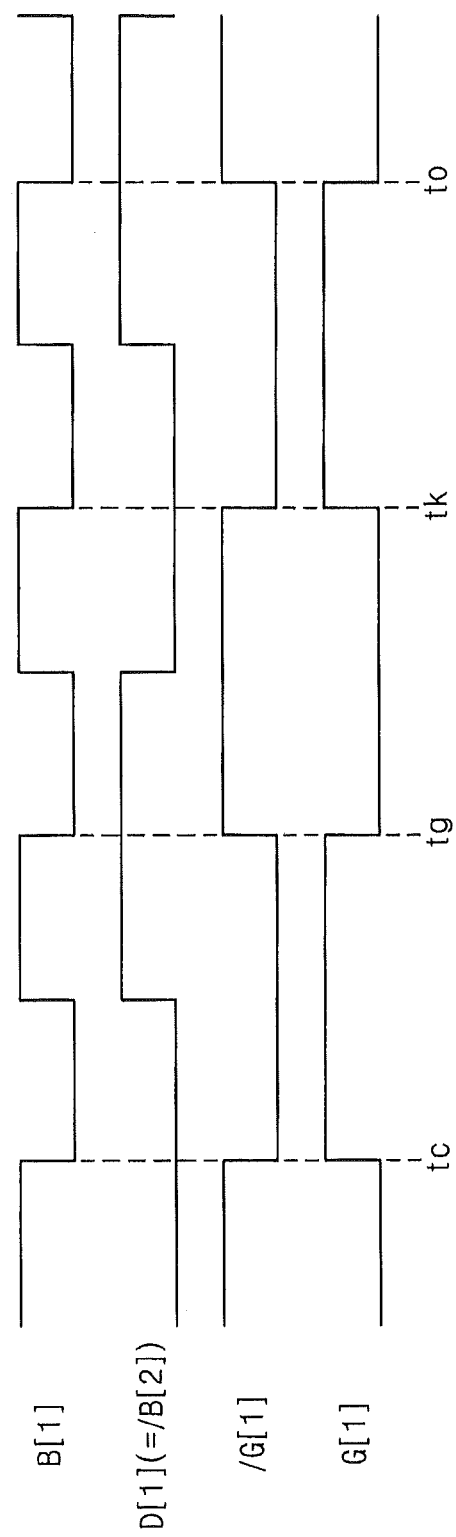

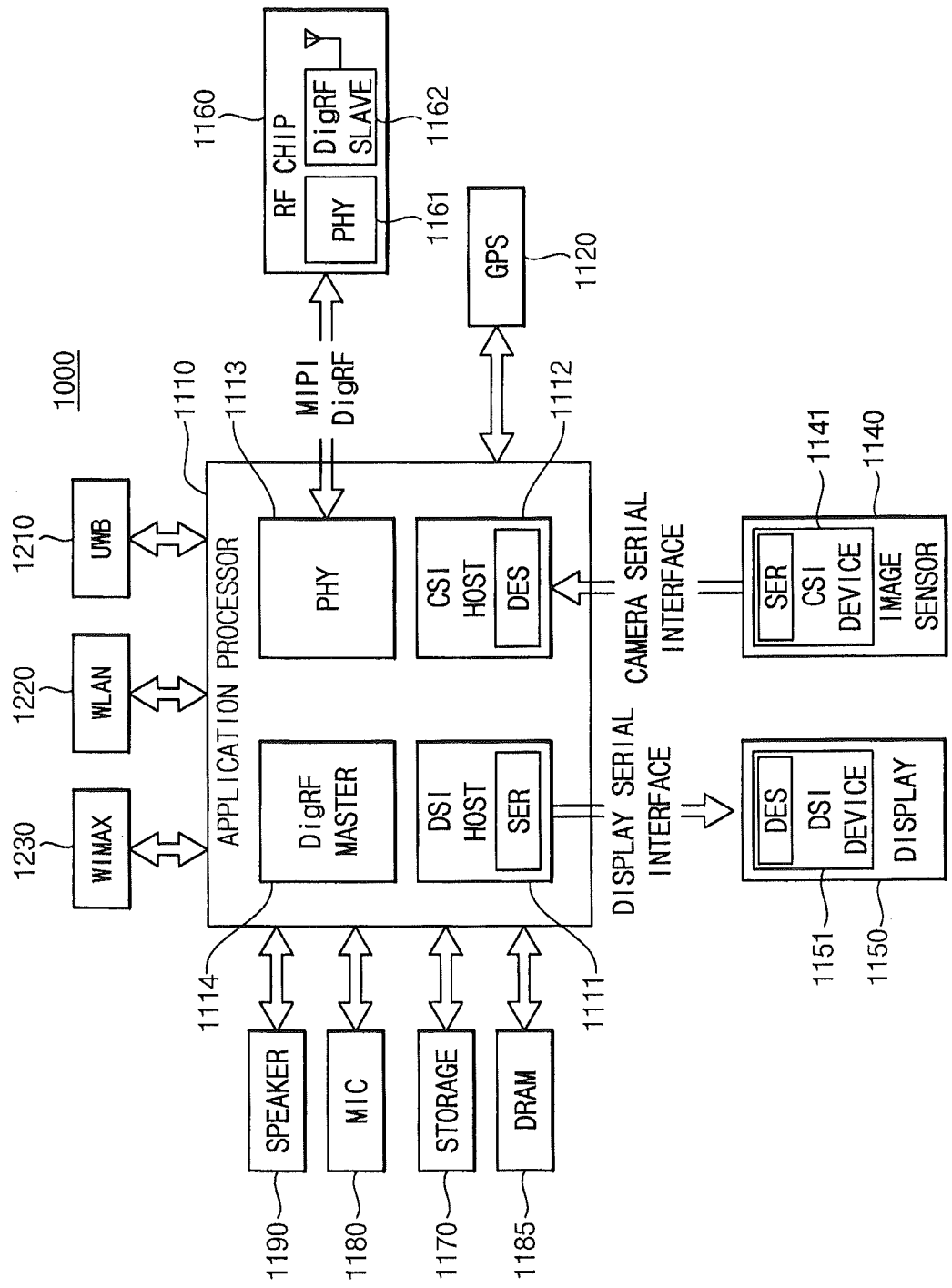

BINARY-TO-GRAY CONVERTING CIRCUITS AND GRAY CODE COUNTER INCLUDING THE SAME

CROSS-REFERENCE TO RELATED APPLICATION

This application claims priority under 35 USC §119 to Korean Patent Application No. 10-2012-0042415, filed on Apr. 24, 2012, in the Korean Intellectual Property Office (KIPO), the contents of which are herein incorporated by reference in their entirety.

BACKGROUND

1. Technical Field

Example embodiments relate generally to converting binary codes into Gray codes.

2. Description of the Related Art

A Gray code is a kind of un-weighted binary code which may be unsuitable for computation. The Gray code is implemented such that two successive values are different by only one bit, so that data errors can be reduced when the Gray code is used as input/output (I/O) codes. Therefore, the Gray code has been widely used for an analog-to-digital converter and/or various I/O apparatuses. In addition, various circuits for converting a binary code into the Gray code have been proposed.

SUMMARY

According to example embodiments, a binary-to-Gray converting circuit includes a buffer unit and a conversion unit. The buffer unit generates a data code of n bits, where n is a natural number equal to or greater than two, in response to a power supply voltage and a second binary bit signal to an $n^{th}$ binary bit signal except for a first binary bit signal. The first binary bit signal corresponds to a least significant bit of a binary code of n bits, and the second through $n^{th}$ binary bit signals correspond to other bits of the binary code. The conversion unit generates a Gray code of n bits based on the binary code and the data code, and generates a $k^{th}$ Gray bit signal, where k is a natural number equal to or greater than one and equal to or less than n, by latching a $k^{th}$ data bit signal in response to a $k^{th}$ binary bit signal. A logic level of the $k^{th}$ Gray bit signal is determined corresponding to a logic level of the $k^{th}$ data bit signal. The $k^{th}$ Gray bit signal corresponds to a $k^{th}$ bit of the Gray code, the $k^{th}$ data bit signal corresponds to a $k^{th}$ bit of the data code, and the $k^{th}$ binary bit signal corresponds to a $k^{th}$ bit of the binary code.

The conversion unit may include a first flip-flop through an $n^{th}$ flip-flop. Each of the first through $n^{th}$ flip-flops may generate one of a first Gray bit signal through an $n^{th}$ Gray bit signal corresponding to a respective one of a first bit through an $n^{th}$ bit of the Gray code.

In example embodiments, each of the first through $n^{th}$ flip-flops may include a data input terminal, a clock input terminal and a data output terminal. One of a first data bit signal through an $n^{th}$ data bit signal corresponding to a respective one of a first bit through an $n^{th}$ bit of the data code may be applied to the data input terminal. One of the first through $n^{th}$ binary bit signals may be applied to the clock input terminal. The data output terminal may output one of the first through $n^{th}$ Gray bit signals.

The buffer unit may include a first inverter through an $(n-1)^{th}$ inverter. Each of the first through $(n-1)^{th}$ inverters may generate a respective one of the first through $(n-1)^{th}$ data bit signals.

The $m^{th}$ inverter, where m is a natural number equal to or greater than one and equal to or less than (n-1), may invert the $(m+1)^{th}$ binary bit signal to generate the $m^{th}$ data bit signal.

The buffer unit may output the power supply voltage as the $n^{th}$ data bit signal.

Each of the first through $n^{th}$ flip-flops may be a positive-edge triggered D flip-flop operating in response to a rising edge of the respective one of the first through $n^{th}$ binary bit signals.

In example embodiments, each of the first through $n^{th}$ flip-flops may include a data input terminal, a clock input terminal and an inverted-data output terminal. One of a first data bit signal through an $n^{th}$ data bit signal corresponding to a respective one of a first bit through an $n^{th}$ bit of the data code may be applied to the data input terminal. One of the first through $n^{th}$ binary bit signals may be applied to the clock input terminal after being inverted. The inverted-data output terminal may output one of the first through $n^{th}$ Gray bit signals.

The buffer unit may include a first inverter through an $(n-1)^{th}$ inverter. Each of the first through $(n-1)^{t1}$ inverters may generate one of the first through $(n-1)^{th}$ data bit signals. The $m^{th}$ inverter, where m is a natural number equal to or greater than one and equal to or less than (n-1), may invert the $(m+1)^{th}$ binary bit signal to generate an $m^{th}$ data bit signal (wherein m is a natural number in a range of 1 to (n-1)). The buffer unit may output the power supply voltage as the $n^{th}$ data bit signal.

Each of the first through $n^{th}$ flip-flops may be a negative-edge triggered D flip-flop operating in response to a falling edge of one of the first to $n^{th}$ binary bit signals.

According to example embodiments, a Gray code counter includes a binary counter circuit and a binary-to-Gray converting circuit. The binary counter circuit generates a binary code of n bits, where n is a natural number equal to or greater than two, based on a power supply voltage and a clock signal. The binary-to-Gray converting circuit generates a Gray code of n bits based on the binary code and the power supply voltage. The binary-to-Gray converting circuit includes a buffer unit and a conversion unit. The buffer unit generates a data code of n bits in response to the power supply voltage and a second binary bit signal to an $n^{th}$ binary bit signal except for a first binary bit signal. The first binary bit signal corresponds to a least significant bit of the binary code, and the second through $n^{th}$ binary bit signals correspond to other bits of the binary code. The first through $n^{th}$ binary bit signals are sequentially toggled. The conversion unit generates the Gray code based on the binary code and the data code and generate a $k^{th}$ Gray bit signal, where k is a natural number equal to or greater than one and equal to or less than n, by latching a $k^{th}$ data bit signal in response to a $k^{th}$ binary bit signal of the binary code. A logic level of the $k^{th}$ Gray bit signal is determined corresponding to a logic level of the $k^{th}$ data bit signal. The $k^{th}$ Gray bit signal corresponds to a $k^{th}$ bit of the Gray code, the $k^{th}$ data bit signal corresponds to a $k^{th}$ bit of the data code, and the $k^{th}$ binary bit signal corresponds to a $k^{th}$ bit of the binary code.

The binary counter circuit may be a synchronous counter circuit or an asynchronous counter circuit.

The binary counter circuit may include a first flip-flop through an $n^{th}$ flip-flop that are cascade-connected. Each of the first through $n^{th}$ flip-flops may generate one of the first through $n^{th}$ binary bit signals in response to the clock signal.

The binary counter circuit may perform an up-counting operation or a down-counting operation.

The conversion unit may include a first flip-flop through an $n^{th}$ flip-flop. Each of the first through $n^{th}$ flip-flops may generate one of a first Gray bit signal through an $n^{th}$ Gray bit signal corresponding to a respective one of a first bit through an $n^{th}$ bit of the Gray code. Each of the first through $n^{th}$ flip-flops may be a positive-edge triggered D flip-flop operating in response to a rising edge of a respective one of the first through $n^{th}$ binary bit signals when the binary counter circuit performs the up-countering operation, and may be a negative-edge triggered D flip-flop operating in response to a falling edge of a respective one of the first through $n^{th}$ binary bit signals when the binary counter circuit performs the down-countering operation.

According to example embodiments, a binary-to-Gray converting circuit includes a buffer unit and a conversion unit. The buffer unit outputs a clock signal and a data signal, both based on a bit included in a binary code to be translated to a Gray code by the binary-to-Gray converting circuit. The conversion unit is coupled to the buffer unit. The conversion unit receives the clock signal at a clock input terminal of an upper stage of the conversion unit and receives the data signal at a data input terminal of a lower stage of the conversion unit, relative to the upper stage.

The buffer unit may further include an input terminal, an output terminal and an inverter circuit. The input terminal may receive the bit included in the binary code to be translated to a Gray code. The output terminal may be coupled to the input terminal, and may provide the bit to the clock input terminal of the upper stage of the conversion unit as the clock signal. The inverter circuit may be coupled to the input terminal, and may invert the bit to provide the data signal to the lower stage of the conversion unit.

The buffer unit may be configured to receive a plurality of parallel bits included in the binary code and may be configured to provide a respective plurality of parallel bits included in a data code provided to the conversion unit. The conversion unit may be configured to receive the respective plurality of parallel bits included in a data code at respective stages of the conversion unit.

An uppermost stage of the conversion unit may receive a static power supply voltage signal as an uppermost bit included in the data code.

A lower order bit included in the binary code may be provided as a lowest stage clock input to the conversion unit.

A second bit included in the binary code may be coupled to the inverter circuit to provide the data signal to the lowest stage of the conversion unit.

The buffer unit may be free of exclusive or combinatorial logic circuitry.

The conversion unit may be free of exclusive or combinatorial logic circuitry.

As described above, the binary-to-Gray converting circuit according to the example embodiments is implemented with a plurality of flip-flops without using a plurality of XOR gates. The binary-to-Gray converting circuit generates a data code in response to the remaining significant bits except for the least significant bit of a binary code and a power supply voltage, and generates the $k^{th}$ bit of the Gray code by latching the $k^{th}$ bit of the data code in response to the $k^{th}$ bit of the binary code, thereby converting the binary code into the Gray code. Therefore, the binary-to-Gray converting circuit can effectively generate a glitch-free Gray code without increasing the size thereof. In addition, the Gray code counter and the analog-to-digital converter including the binary-to-Gray converting circuit can easily perform timing control and can reduce the power consumption.

BRIEF DESCRIPTION OF THE DRAWINGS

Illustrative, non-limiting example embodiments will be more clearly understood from the following detailed description taken in conjunction with the accompanying drawings.

FIGS. 3, 4A, 4B, 4C and 4D are timing diagrams for describing operations of the binary-to-Gray converting circuit of FIG. 2.

FIGS. 8, 9A, 9B, 9C and 9D are timing diagrams for describing operations of the binary-to-Gray converting circuit of FIG. 7.

FIG. 20 is a block diagram illustrating one example of an interface used in the computing system of FIG. 19.

DETAILED DESCRIPTION OF THE EMBODIMENTS

Figure 1:
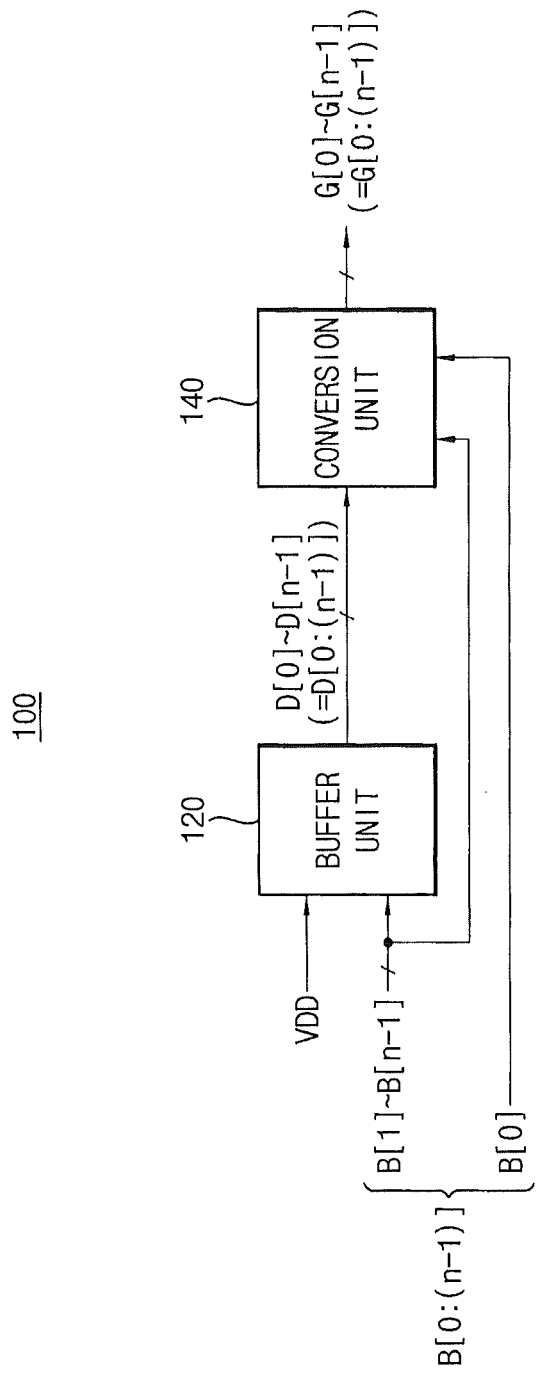
FIG. 1 is a block diagram illustrating a binary-to-Gray converting circuit according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein.

Rather, these example embodiments are provided so that this disclosure will be thorough and complete, and will fully convey the scope of the present inventive concept to those skilled in the art. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments according to the inventive concept, a binary-to-Gray converting circuit can include a buffer unit that is configured to output a clock signal and a data signal, both based on a bit included in a binary code to be translated to a Gray code by the binary-to-Gray converting circuit. A conversion unit can be coupled to the buffer unit, which can be configured to receive the clock signal at a clock input terminal of an upper stage of the conversion unit and configured to receive the data signal at a data input terminal of a lower stage of the conversion unit, relative to the upper stage.

In some embodiments according to the inventive concept, the buffer unit further can include an input terminal that can be configured to receive the bit included in the binary code to be translated to a Gray code. An output terminal can be coupled to the input terminal, and can be configured to provide the bit to the clock input terminal of the upper stage of the conversion unit as the clock signal. An inverter circuit can be coupled to the input terminal, and can be configured to invert the bit to provide the data signal to the lower stage of the conversion unit.

In some embodiments according to the inventive concept, the buffer unit can be configured to receive a plurality of parallel bits included in the binary code and can be configured to provide a respective plurality of parallel bits included in a data code provided to the conversion unit. The conversion unit can be configured to receive the respective plurality of parallel bits included in a data code at respective stages of the conversion unit.

In some embodiments according to the inventive concept, an uppermost stage of the conversion unit receives a static power supply voltage signal as an uppermost bit included in the data code. In some embodiments according to the inventive concept, a lower order bit included in the binary code is provided as a lowest stage clock input to the conversion unit.

In some embodiments according to the inventive concept, a second bit included in the binary code is coupled to the inverter circuit to provide the data signal to the lowest stage of the conversion unit.

FIG. 1 is a block diagram illustrating a binary-to-Gray converting circuit according to example embodiments.

Referring to FIG. 1, a binary-to-Gray converting circuit 100 includes a buffer unit 120 and a conversion unit 140.

The buffer unit 120 generates a data code $D[0:(n-1)]$ of n bits, where n is a natural number equal to or greater than two, based on some of a binary code $B[0:(n-1)]$ of n bits and a power supply voltage VDD. In detail, the buffer unit 120 generates the data code $D[0:(n-1)]$ in response to the power supply voltage VDD and a second binary bit signal $B[1]$ through an $n^{th}$ binary bit signal $B[n-1]$. The buffer unit 120 does not utilize the first binary bit signal $B[1]$ in generating the data code. The first binary bit signal $B[0]$ corresponds to a least significant bit (LSB) of the binary code $B[0:(n-1)]$, and the second through $n^{th}$ binary bit signals $B[1]$~$B[n-1]$ corresponds to other bits of the binary code $B[0:(n-1)]$.

Each of the binary code $B[0:(n-1)]$ and the data code $D[0:(n-1)]$ may include a first bit through an $n^{th}$ bit. For example, the first bit may be the LSB and the $n^{th}$ bit may be a most significant bit (MSB). The binary code $B[0:(n-1)]$ may be implemented with the first binary bit signal $B[0]$ corresponding to the first bit (e.g., the LSB) through the $n^{th}$ binary bit signal $B[(n-1)]$ corresponding to the $n^{th}$ bit (e.g., the MSB). The data code $D[0:(n-1)]$ may be implemented with the first data bit signal $D[0]$ corresponding to the first bit (e.g., the LSB) through the $n^{th}$ data bit signal $D[n-1]$ corresponding to the $n^{th}$ bit (e.g., the MSB). In other words, the buffer unit 120 can generate n bits of the data code based on n-1 bits of the binary code.

The conversion unit 140 generates a Gray code $G[0:(n-1)]$ of n bits based on the binary code $B[0:(n-1)]$ and the data code $D[0:(n-1)]$. In detail, the conversion unit 140 generates a $k^{th}$ Gray bit signal, where k is a natural number equal to or greater than one and equal to or less than n, by latching a $k^{th}$ data bit signal in response to a $k^{th}$ binary bit signal. A logic level of the $k^{th}$ Gray bit signal is determined corresponding to a logic level of the $k^{th}$ data bit signal. The $k^{th}$ Gray bit signal corresponds to a $k^{th}$ bit of the Gray code $G[0:(n-1)]$, the $k^{th}$ data bit signal corresponds to a $k^{th}$ bit of the data code $D[0:(n-1)]$, and the $k^{th}$ binary bit signal corresponds to a $k^{th}$ bit of the binary code $B[0:(n-1)]$. The Gray code $G[0:(n-1)]$ may also include a first bit through an $n^{th}$ bit. The Gray code $G[0:(n-1)]$ may be implemented with a first Gray bit signal $G[0]$ corresponding to the first bit (e.g., the LSB) through an $n^{th}$ Gray bit signal $G[n-1]$ corresponding to the $n^{th}$ bit (e.g., the MSB).

In example embodiments, the conversion unit 140 may include a first flip-flop through an $n^{th}$ flip-flop. A $k^{th}$ flip-flop of the first through $n^{th}$ flip-flops may generate the $k^{th}$ Gray bit signal in response to the $k^{th}$ binary bit signal and the $k^{th}$ data bit signal. Each of the first through $n^{th}$ flip-flops may be implemented in the form of a positive-edge triggered flip-flop or a negative-edge triggered flip-flop depending on whether the binary code $B[0:(n-1)]$ counts up or counts down. According to example embodiments, the buffer unit 120 may invert an $(m+1)^{th}$ binary bit signal, where m is a natural number equal to or greater than one and equal to or less than (n-1), to output the inverted $(m+1)^{th}$ binary bit signal as an $m^{th}$ data bit signal, or may output the $(m+1)^{th}$ binary bit signal itself as the $m^{th}$ data bit signal. In addition, the buffer unit 120 may output a power supply voltage as the $n^{th}$ data bit signal D[n]. A detailed configuration of the binary-to-Gray converting circuit 100 will be described below with reference to FIGS. 2, 5, 6 and 7.

A conventional binary-to-Gray converting circuit can include a plurality of XOR gates, and generates a Gray code by performing an XOR operation on adjacent pairs of bits of a binary code provided from a binary counter circuit. The conventional binary-to-Gray converting circuit including the XOR gates, however, may cause glitches at a time point at which a logic level of each bit of the binary code is transitioned. To prevent the glitches, a synchronous counter circuit has been used as a counter circuit for providing the binary code, however, there has been a limit to remove the glitches due to difference in paths of clock signals, input paths of bits of the binary code, and characteristics of logics for outputting the Gray code. To remove the glitches, a scheme of retiming the Gray code has been further proposed. However, since the Gray code is retimed based on a relatively high driving frequency, a timing control of the binary-to-Gray converting circuit having the retiming scheme may be relatively difficult, margins for setup time and hold time of the binary-to-Gray converting circuit having the retiming scheme are reduced, and the binary-to-Gray converting circuit having the retiming scheme may have relatively high power consumption.

The binary-to-Gray converting circuit 100 according to example embodiments may include a plurality of flip-flops without using a plurality of XOR gates. The binary-to-Gray converting circuit 100 generates the data code D[0:(n−1)] in response to the bits of the binary code B[0:(n−1)] (except for the LSB of the binary code B[0:(n−1)]) and the power supply voltage VDD, and generates the $k^{th}$ bit of the Gray code G[0:(n−1)] by latching the $k^{th}$ bit of the data code D[0:(n−1)] in response to the $k^{th}$ bit of the binary code B[0:(n−1)], thereby converting the binary code B [0: (n−1)] into the Gray code G[0:(n−1)]. Accordingly, the binary-to-Gray converting circuit 100 may effectively generate the glitch-free Gray code G[0:(n−1)] without increasing the size thereof. In addition, since the binary-to-Gray converting circuit 100 uses a low driving frequency as compared with the conventional scheme of retiming the Gray code, the operation timing may be more easily controlled, the margins for the setup time and the hold time may be increased, and the power consumption may be reduced.

Figure 2:
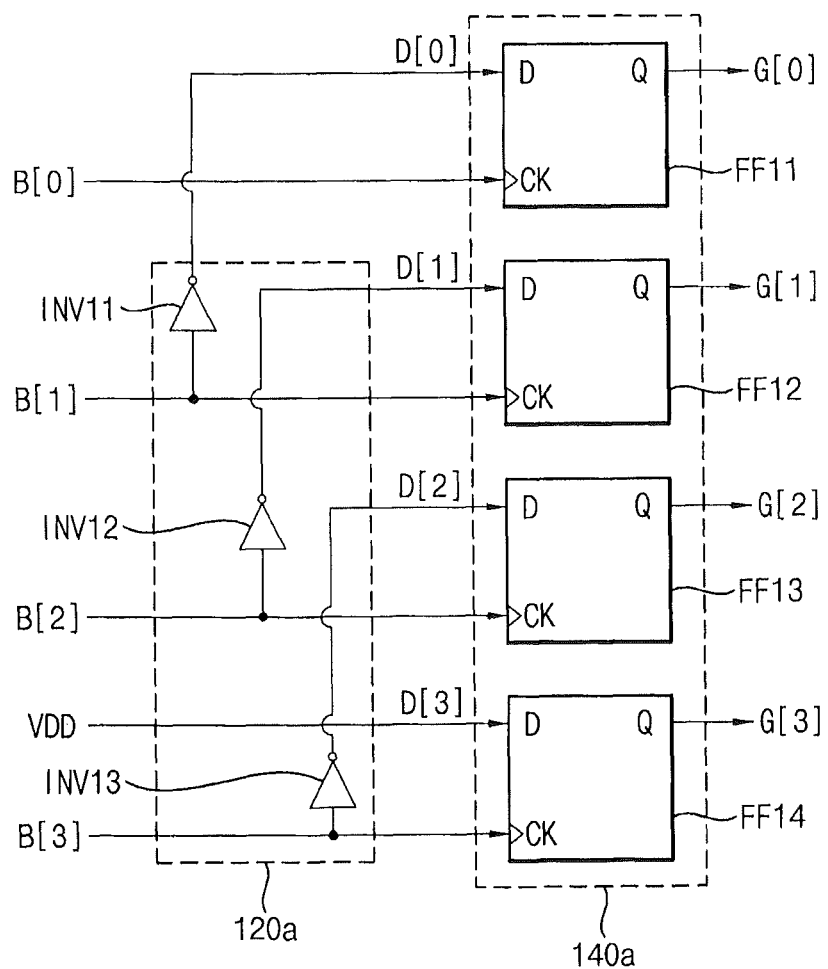
FIG. 2 is a block diagram illustrating an example of the binary-to-Gray converting circuit of FIG. 1.

FIG. 2 is a block diagram illustrating an example of the binary-to-Gray converting circuit of FIG. 1.

Referring to FIG. 2, a binary-to-Gray converting circuit 100a includes a buffer unit 120a and a conversion unit 140a. The buffer unit 120a may include a first inverter INV11, a second inverter INV12 and a third inverter INV13, and the conversion unit 140a may include a first flip-flop FF11, a second flip-flop FF12, a third flip-flop FF13 and a fourth flip-flop FF14. Hereinafter, for the purpose of convenience of explanation, the configuration and the operation of the binary-to-Gray converting circuit 100a will be described using a 4-bit digital signal G[0], G[1], G[2] and G[3], e.g., a 4-bit Gray code G[0:3], generated by the binary-to-Gray converting circuit 100a. It will be understood, however, that embodiments according to the invention can be used to implement any size circuit 100 to process any arbitrary number of bits in the binary code.

Each of the inverters INV11, INV12 and INV13 may invert one of the second through fourth binary bit signals B[1], B[2] and B[3] to generate a respective one of the first through third data bit signals D[0], D[1] and D[2]. For example, the first inverter INV11 may invert the second binary bit signal B[1] to generate the first data bit signal D[0], the second inverter INV12 may invert the third binary bit signal B[2] to generate the second data bit signal D[1], and the third inverter INV13 may invert the fourth binary bit signal B[3] to generate the third data bit signal D[2]. The buffer unit 120a may output the power supply voltage VDD as the fourth data bit signal D[3]. The buffer unit 120a may further include a buffer for outputting the fourth data bit signal D[3], and the buffer may be implemented in the form of two inverters connected to each other in series. It will be understood that the VDD signal can provide the MSB of the binary code provided to the buffer unit 120a.

Each of the flip-flops FF11, FF12, FF13 and FF14 included in the conversion unit 140a may include a data input terminal D that receives one of the first through fourth data bit signals D[0], D[1], D[2] and D[3], a clock input terminal CK that receives a respective one of the first through fourth binary bit signals B[0], B[1], B[2] and B[3], and a data output terminal Q that outputs a respective one of the first through fourth Gray bit signals G[0], G[1], G[2] and G[3]. Each of the flip-flops FF11, FF12, FF13 and FF14 may latch one of the first through fourth data bit signals D[0], D[1], D[2] and D[3] in response to the respective one of the first through fourth binary bit signals B[0], B[1], B[2] and B[3] to generate the respective one of the first through fourth Gray bit signals G[0], G[1], G[2] and G[3] such that the logic level of the respective one of the first through fourth Gray bit signals G[0], G[1], G[2] and G[3] is determined corresponding to the logic level of one of the first through fourth data bit signals D[0], D[1], D[2] and D[3]. For example, the first flip-flop FF11 may include the data input terminal D that receives the first data bit signal D[0], the clock input terminal CK that receives the first binary bit signal B[0] and the data output terminal Q that outputs the first Gray bit signal G[0], and may latch the first data bit signal D[0] in response to the first binary bit signal B[0] to generate the first Gray bit signal G[0] such that the logic level of the first Gray bit signal G[0] is determined corresponding to the logic level of the first data bit signal D[0].

According to example embodiments, the first through third data bit signals D[0], D[1] and D[2] may be provided from inverted data output terminals of a binary counter circuit (e.g., 220 in FIG. 10), and in this case, the inverters INV11, INV12 and INV13 included in the buffer unit 120a may be omitted.

The binary-to-Gray converting circuit 100a of FIG. 2 may convert the binary code B[0:3], which is up-counted, into the Gray code G[0:3], which is up-counted, and each of the flip-flops FF11, FF12, FF13 and FF14 may be a positive-edge triggered flip-flop for performing such up-counting operation. Hereinafter, the up-counting operation will be described in detail with reference to FIGS. 3, 4A, 4B, 4C and 4D.

According to FIG. 2, therefore, in some embodiments according to the invention, upper stage bits in the data code can be "shifted" downward (and may also be inverted) to provide data to the neighboring lower stage, whereas the neighboring lower stage is clocked using the bit of the data code that corresponds to that neighboring lower stage. In other words, a bit of the data code, that corresponds to a particular stage of the conversion unit, can be used both as data (for a neighboring lower stage) as well as a clock for the particular stage. This approach can be utilized to increase the stability of the data code bits presented as the inputs to the stages of the conversion unit as each stage can be presented with data that is stable before relatively higher frequency clock edge occurs at the same stage.

FIGS. 3, 4A, 4B, 4C and 4D are timing diagrams for describing an operation of the binary-to-Gray converting circuit of FIG. 2.

Figure 10:
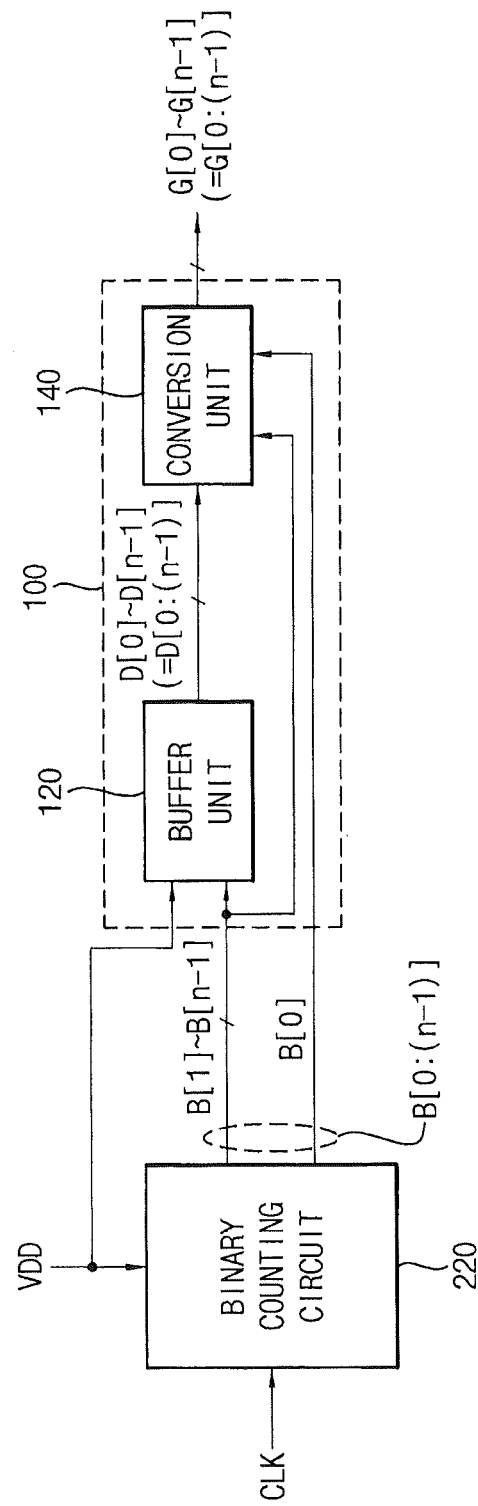
FIG. 10 is a block diagram illustrating a Gray code counter including a binary-to-Gray converting circuit according to example embodiments.

Referring to FIGS. 2, 3, 4A, 4B, 4C and 4D, the binary code B[0:3] may be output from the binary counter circuit (e.g., 220 of FIG. 10). The first binary bit signal B[0] corresponding to the LSB of the binary code B[0:3] is toggled in every time points t0, t1, t2, t3, t4, t5, t6, t7, t8, t9, t10, t11, t12, t13, t14, t15 and t16 corresponding to rising or falling edges of the clock signal (e.g., CLK of FIG. 10). Each of the second through fourth binary bit signals B[1], B[2] and B[3] corresponding to other bits of the binary code B[0:3] is toggled in response to the falling edges of neighboring lower bit. For example, the second binary bit signal B[1] is toggled in response to the falling edges (e.g., time points of t2, t4, t6, t8, t10, t12, t14 and t16) of the first binary bit signal B[0], the third binary bit signal B[2] is toggled in response to the falling edges (e.g., time points of t4, t8, t12 and t16) of the second binary bit signal B[1], and the fourth binary bit signal B[3] is toggled in response to the falling edges (e.g., time points of t8 and t16) of the third binary bit signal B[2]. As a result, the first through fourth binary bit signals B[0], B[1], B[2] and B[3] have periods which are sequentially doubled.

Figure 4A:
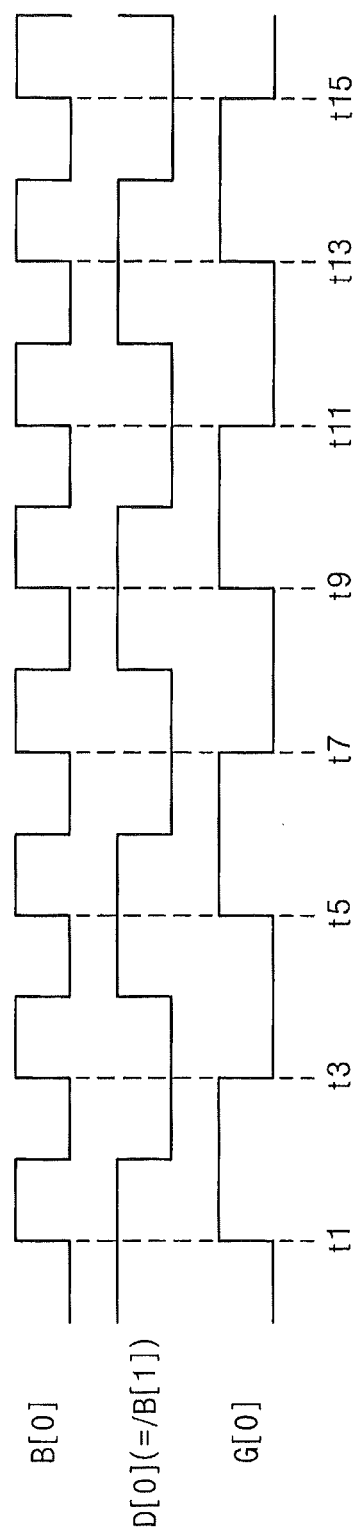
Figure 4C:
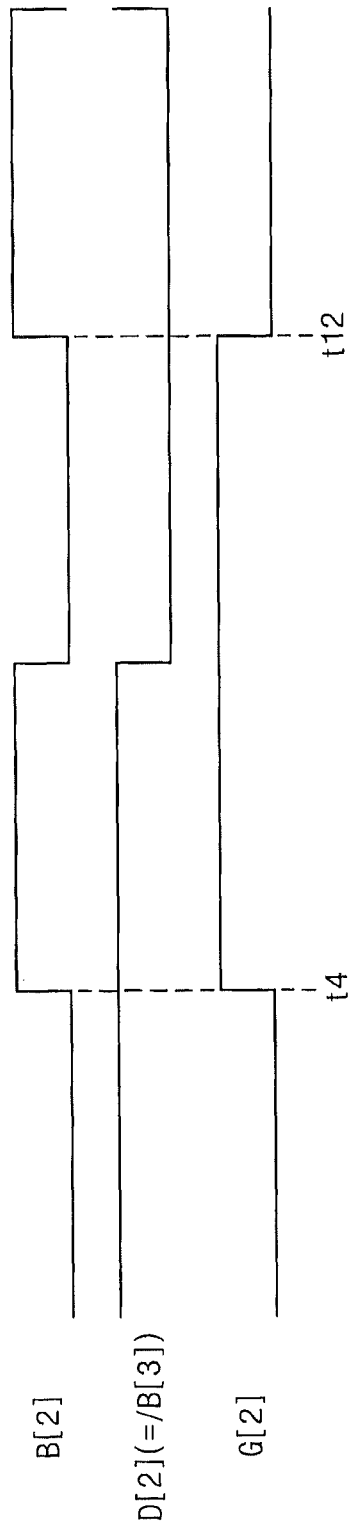
Figure 4D:
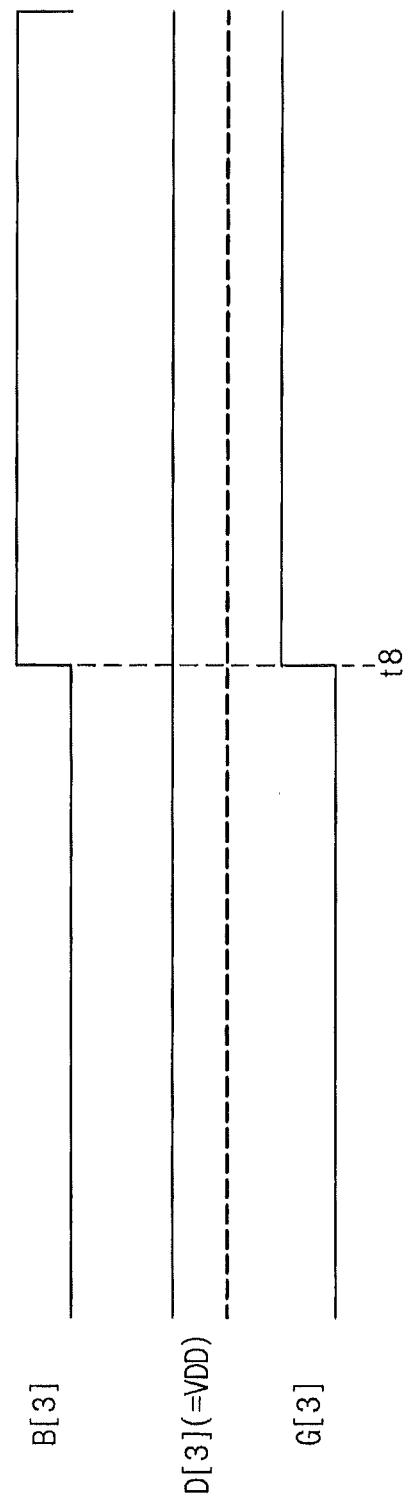

Each of the first through fourth Gray bit signals G[0], G[1], G[2] and G[3] corresponding to each bit of the Gray code G[0:3] is toggled in response to the rising edges of the corresponding signal of the first through fourth binary bit signals B[0], B[1], B[2] and B[3]. For example, as shown in FIG. 4A, the first Gray bit signal G[0] is toggled in response to the rising edges (e.g., time points of t1, t3, t5, t7, t9, t11, t13, and t15) of the first binary bit signal B[0] such that the logic level of the first Gray bit signal G[0] is determined corresponding to the logic level of the first data bit signal D[0], that is, the inverted signal /B[1] of the second binary bit signal. As shown in FIG. 4B, the second Gray bit signal G[1] is toggled in response to the rising edges (e.g., time points of t2, t6, t10, and t14) of the second binary bit signal B[1] such that the logic level of the second Gray bit signal G[1] is determined corresponding to the logic level of the second data bit signal D[1], that is, the inverted signal /B[2] of the third binary bit signal. As shown in FIG. 4C, the third Gray bit signal G[2] is toggled in response to the rising edges (e.g., the time points of t4 and t12) of the third binary bit signal B[2] such that the logic level of the third Gray bit signal G[2] is determined corresponding to the logic level of the third data bit signal D[2], that is, the inverted signal /B[3] of the fourth binary bit signal. As shown in FIG. 4D, the fourth Gray bit signal G[3] is in response to the rising edge (e.g., time point of t8) of the fourth binary bit signal B[3] such that the logic level of the fourth Gray bit signal G[3] is determined correspond to the logic level of the fourth data bit signal D[3], that is, the power supply voltage VDD.

In an upper end portion of FIG. 3, the values of the binary code B[0:3] and the Gray code G[0:3] at each end time point during the counting operation over time are denoted, and the binary code B[0:3] is increased as to "0000, 0001, 0010, 0011, . . . " and the Gray code G[0:3] is increased as to "0000, 0001, 0011, 0010, . . . ", so it may be recognized that the up-counting operation is performed.

Figure 5:
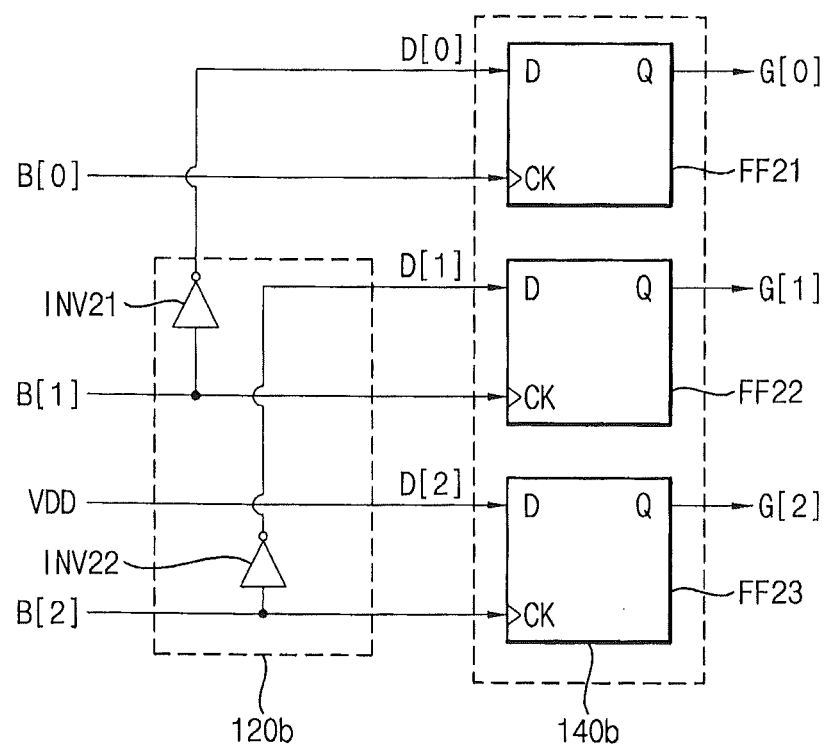
FIGS. 5 and 6 are block diagrams illustrating other examples of the binary-to-Gray converting circuit of FIG. 1.
Figure 6:
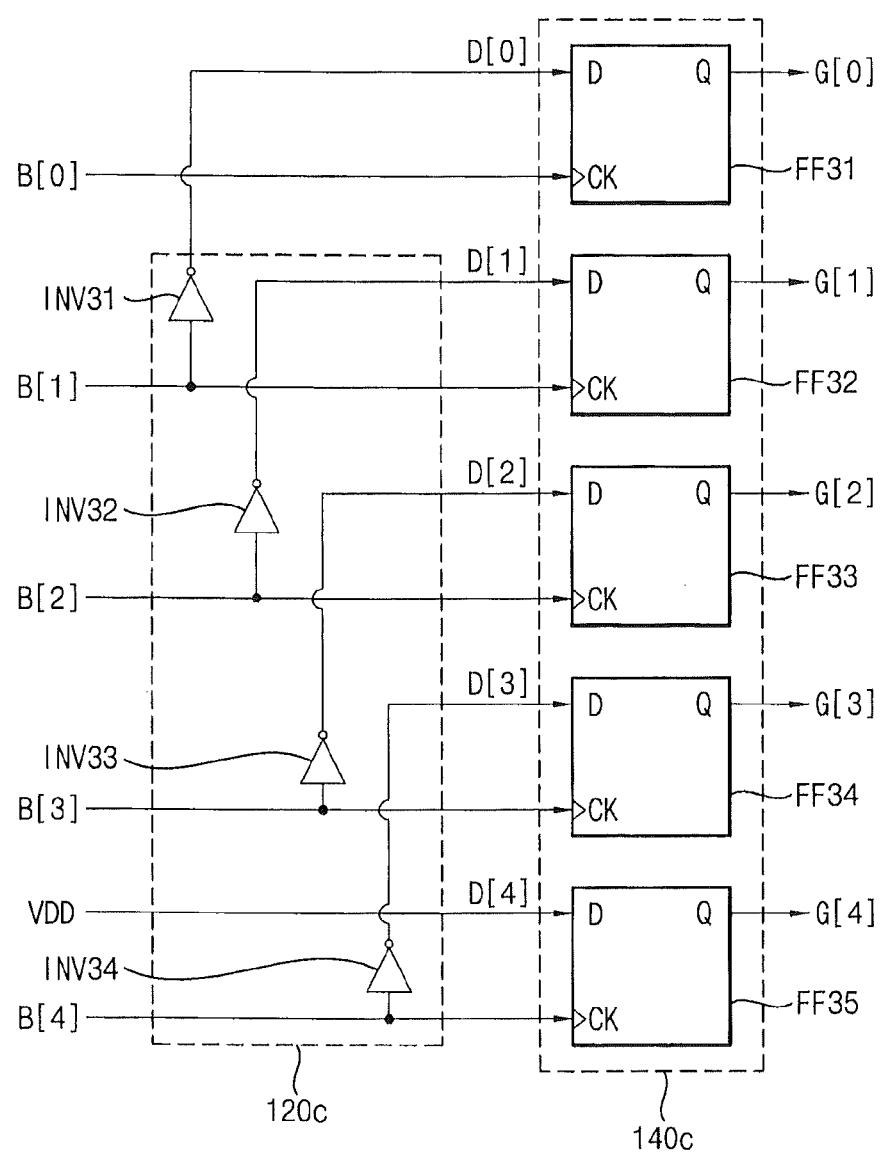

FIGS. 5 and 6 are block diagrams illustrating other examples of the binary-to-Gray converting circuit of FIG. 1.

Referring to FIG. 5, a binary-to-Gray converting circuit 100b includes a buffer unit 120b and a conversion unit 140b.

The binary-to-Gray converting circuit 100b may be substantially the same as the binary-to-Gray converting circuit 100a of FIG. 2 except that the binary-to-Gray converting circuit 100b generates a 3-bit Gray code G[0:2]. For example, the buffer unit 120b may include a first inverter INV21 and a second inverter INV22 and may output the power supply voltage VDD as a third data bit signal D[2]. Each of the inverters INV21 and INV22 may invert one of the second and third binary bit signals B[1] and B[2] to generate a respective one of the first and second data bit signals D[0] and D[1]. The conversion unit 140b may include a first flip-flop FF21, a second flip-flop FF22 and a third flip-flop FF23. Each of the flip-flops FF21, FF22 and FF23 may include a data input terminal D the receives one of the first through third data bit signals D[0], D[1] and D[2], a clock input terminal CK that receives a respective one of the first through third binary bit signals B[0], B[1] and B[2], and a data output terminal Q that outputs a respective one of the first through third Gray bit signals G[0], G[1] and G[2]. Each of the flip-flops FF21, FF22 and FF23 may latch one of the first through third data bit signals D[0], D[1] and D[2] in response to the respective one of the first through third binary bit signals B[0], B[1] and B[2] to generate the respective one of the first through third Gray bit signals G[0], G[1] and G[2] such that the logic level of the respective one of the first through third Gray bit signals G[0], G[1] and G[2] is determined corresponding to the logic level of one of the first through third data bit signals D[0], D[1] and D[2].

Referring to FIG. 6, a binary-to-Gray converting circuit 100c includes a buffer unit 120c and a conversion unit 140c.

The binary-to-Gray converting circuit 100c may be substantially the same as the binary-to-Gray converting circuit 100a of FIG. 2 except that the binary-to-Gray converting circuit 100c generates a 5-bit Gray code G[0:4]. For example, the buffer unit 120c may include a first inverter INV31, a second inverter INV32, a third inverter INV33 and a fourth inverter INV34, and may output the power supply voltage VDD as a fifth data bit signal D[4]. Each of the inverters INV31 through INV34 may invert one of the second through fifth binary bit signals B[1], B[2], B[3] and B[4] to generate a respective one of the first through fourth data bit signals D[0], D[1], D[2] and D[3]. The conversion unit 140c may include a first flip-flop FF31, a second flip-flop FF32, a third flip-flop FF33, a fourth flip-flop FF34 and a fifth flip-flop FF35. Each of the flip-flops FF31 through FF35 may include a data input terminal D that receives one of the first to fifth data bit signals D[0], D[1], D[2], D[3] and D[4], a clock input terminal CK that receives a respective one of the first through fifth binary bit signals B[0], B[1], B[2], B[3] and B[4], and a data output terminal Q that outputs a respective one of the first through fifth Gray bit signals G[0], G[1], G[2], G[3] and G[4]. Each of the flip-flops FF31 to FF35 may latch one of the first through fifth data bit signals D[0], D[1], D[2], D[3] and D[4] in response to the respective one of the first through fifth binary bit signals B[0], B[1], B[2], B[3] and B[4] to generate the respective one of the first through fifth Gray bit signals G[0], G[1], G[2], G[3] and G[4] such that the logic level of the respective one of the first through fifth Gray bit signals G[0], G[1], G[2], G[3] and G[4] is determined corresponding to the logic level of one of the first through fifth data bit signals D[0], D[1], D[2], D[3] and D[4].

As described above with reference to FIGS. 2, 5 and 6, the configuration of the binary-to-Gray conversion circuit according to example embodiments may be changed depending on the number of bits of the input binary code and the number of bits of the output Gray code, and the binary-to-Gray conversion circuit may be configured with the (n–1) inverters and the n positive-edge triggered flip-flops to convert an n-bit binary code, which is up-countered, into an n-bit Gray code which is up-counted.

Figure 7:
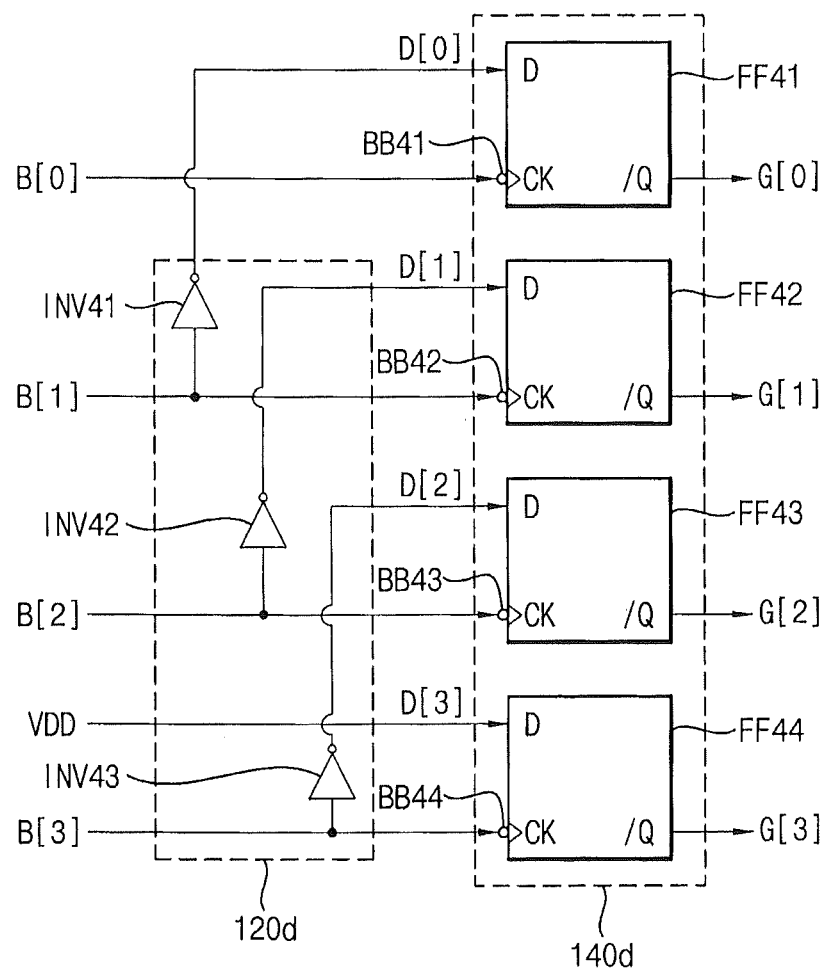
FIG. 7 is a block diagram illustrating still another example of the binary-to-Gray converting circuit of FIG. 1.

FIG. 7 is a block diagram illustrating still another example of the binary-to-Gray converting circuit of FIG. 1.

Referring to FIG. 7, a binary-to-Gray converting circuit 100d includes a buffer unit 120d and a conversion unit 140d. Hereinafter, for the purpose of convenience of explanation, the configuration and the operation of the binary-to-Gray converting circuit 100d will be described on the assumption that a 4-bit digital signal G[0], G[1], G[2] and G[3], e.g., a 4-bit Gray code G[0:3], is generated by the binary-to-Gray converting circuit 100d.

The buffer unit 120d may include a first inverter INV41, a second inverter INV42, and a third inverter INV43. Each of the inverters INV41, INV42 and INV3 may invert one of the second through fourth binary bit signals B[1], B[2] and B[3] to generate a respective one of a first through third data bit signals D[0], D[1] and D[2]. The buffer unit 120d may output the power supply voltage VDD as the fourth data bit signal D[3].

The conversion unit 140d may include a first flip-flop FF41, a second flip-flop FF42, a third flip-flop FF43 and a fourth flip-flop FF44. Each of the flip-flops FF41 through FF44 may include a data input terminal D that receives one of the first through fourth data bit signals D[0], D[1], D[2] and D[3], a clock input terminal CK that receives an inversion signal of a respective one of the first through fourth binary bit signals B[0], B[1], B[2] and B[3], and an inverted-data output terminal /Q that outputs a respective one of the first through fourth Gray bit signals G[0], G[1], G[2] and G[3]. Each of the flip-flops FF41 through FF44 may include one of bubbles BB41, BB42, BB43 and BB44, which invert a respective one of the first through fourth binary bit signals B[0], B[1], B[2] and B[3] to provide the inverted bit signal to the clock input terminal CK. Each of the flip-flops FF41 through FF44 may latch one of the first through fourth data bit signals D[0], D[1], D[2] and D[3] in response to the respective one of the first through fourth binary bit signals B[0], B[1], B[2] and B[3] to generate the respective one of the first through fourth Gray bit signals G[0], G[1], G[2] and G[3] such that the logic level of the respective one of the first through fourth Gray bit signals G[0], G[1], G[2] and G[3] is determined corresponding to a logic level of one of the first to fourth data bit signals D[0], D[1], D[2] and D[3].

The binary-to-Gray converting circuit 100d of FIG. 7 may convert the binary code B[0:3], which is down-counted, to the Gray code G[0:3], which is down-counted, and each of the flip-flops FF41 through FF44 may be a negative-edge triggered flip-flop for performing such down-counting operation. Hereinafter, the down-counting operation will be described in detail with reference to FIGS. 8, 9A, 9B, 9C and 9D.

FIGS. 8, 9A, 9B, 9C and 9D are timing diagrams illustrating the operation of the binary-to-Gray converting circuit of FIG. 7.

Referring to FIGS. 7, 8, 9A, 9B, 9C and 9D, the binary code B[0:3] may be output from the binary counter circuit (e.g., 220 of FIG. 10). The first binary bit signal B[0] corresponding to the LSB of the binary code B[0:3] is toggled in every time point ta, tb, tc, td, te, tf, tg, th, ti, tj, tk, tl, tm, tn, to, tp and tq corresponding to rising or falling edges of the clock signal (e.g., CLK of FIG. 10). Each of the second through fourth binary bit signals B[1], B[2] and B[3] corresponding to other bits of the binary code is toggled in response to the rising edges of neighboring lower bit. For example, the second binary bit signal B[1] is toggled in response to the rising edges (e.g., time points of tc, te, tg, ti, tk, tm, to and tq) of the first binary bit signal B[0], the third binary bit signal B[2] is toggled in response to the rising edges (e.g., time points of te, ti, tm and tq) of the second binary bit signal B[1], and the fourth binary bit signal B[3] is toggled in response to the rising edges (e.g., time points of ti and tq) of the third binary bit signal B[2].

Figure 9C:
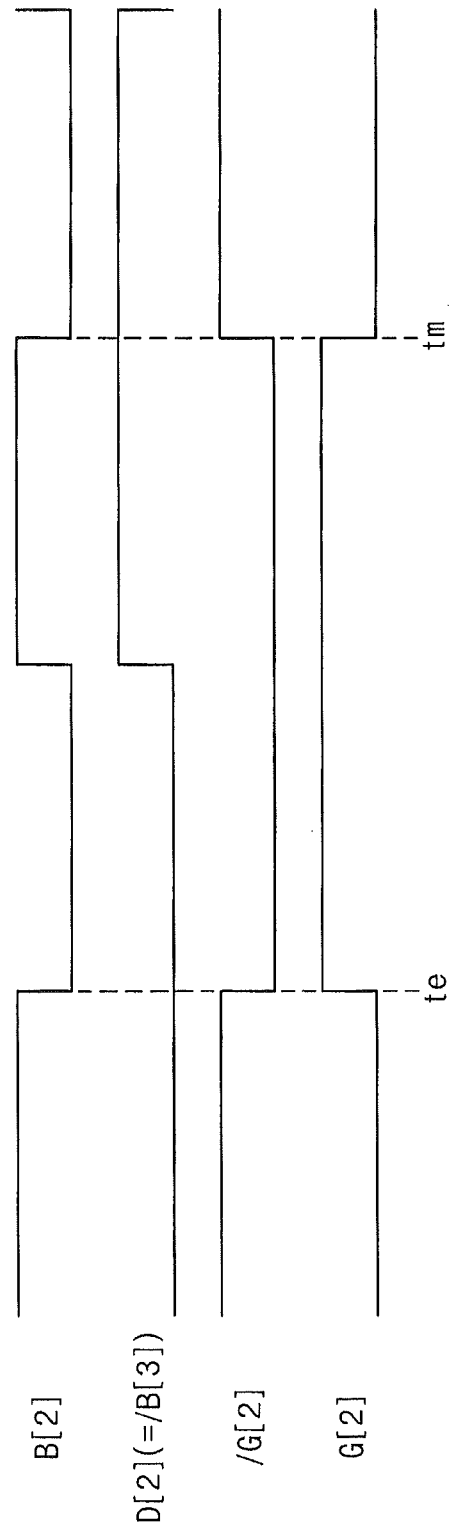
Figure 9D:
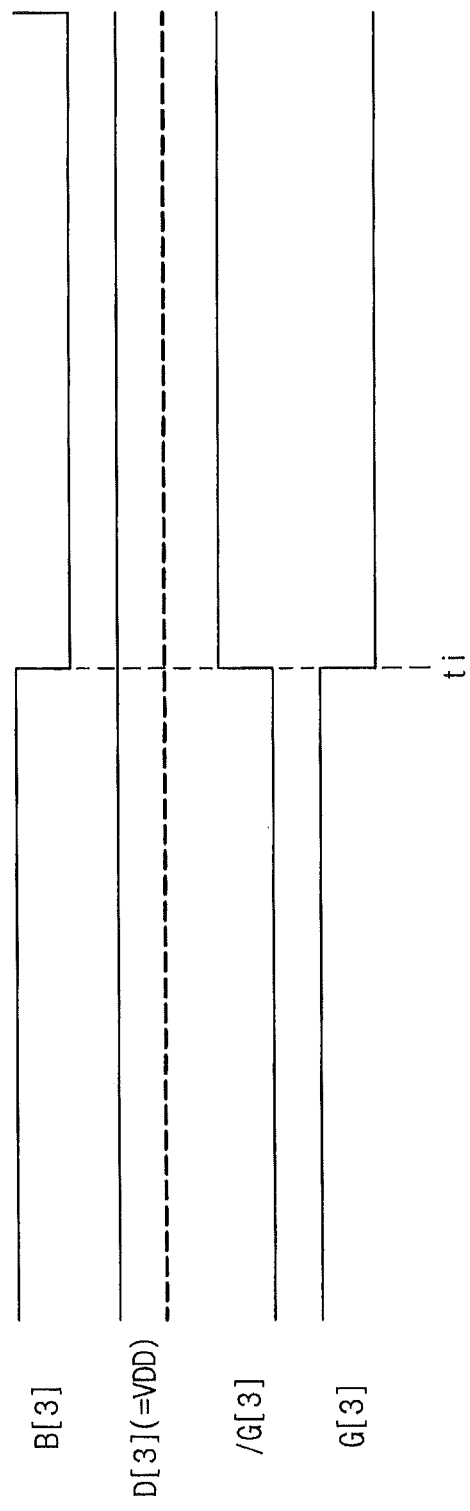

Each of the first to fourth Gray bit signals G[0], G[1], G[2] and G[3] corresponding to each bit of the Gray code G[0:3] is toggled in response to falling edges of the corresponding signal of the first through fourth bit signals B[0], B[1], B[2] and B[3]. For example, as shown in FIG. 9A, the inverted signal /G[0] of the first Gray bit signal G[0] is toggled in response to the falling edge (e.g., time points of tb, td, tf, th, tj, tl, to and tp) of the first binary bit signal B[0], and is inverted to provide the first Gray bit signal G[0]. The logic level of the inverted signal /G[0] of the first Gray bit signal G[0] is determined corresponding to the logic level of the first data bit signal D[0] (that is, the inverted signal /B[1] of the second binary bit signal). As shown in FIG. 9B, the inverted signal /G[1] of the second Gray bit signal G[1] is toggled in response to the falling edge (e.g., time points of tc, tg, tk and to) of the second binary bit signal B[1], and is inverted to provide the second Gray bit signal G[1]. The logic level of the inverted signal /G[1] of the second Gray bit signal G[1] is determined corresponding to the logic level of the second data bit signal D[1] (that is, the inverted signal /B[2] of the third binary bit signal). As shown in FIG. 9C, the inverted signal /G[2] of the third Gray bit signal G[2] is toggled in response to the falling edge (e.g., time points of te, and tm) of the third binary bit signal B[2], and is inverted to provide the third Gray bit signal G[2]. The logic level of the inverted signal /G[2] of the third Gray bit signal G[2] is determined corresponding to the logic level of the third data bit signal D[2] (that is, the inverted signal /B[3] of the fourth binary bit signal). As shown in FIG. 9D, the inverted signal /G[3] of the fourth Gray bit signal G[3] is toggled in response to the falling edge (e.g., time point of ti) of the fourth binary bit signal B[3], and is inverted to provide the fourth Gray bit signal G[3]. The logic level of the inverted signal /G[3] of the fourth Gray bit signal G[3] is determined corresponding to the logic level of the fourth data bit signal D[3] (that is, the power supply voltage VDD).

Figure 8:
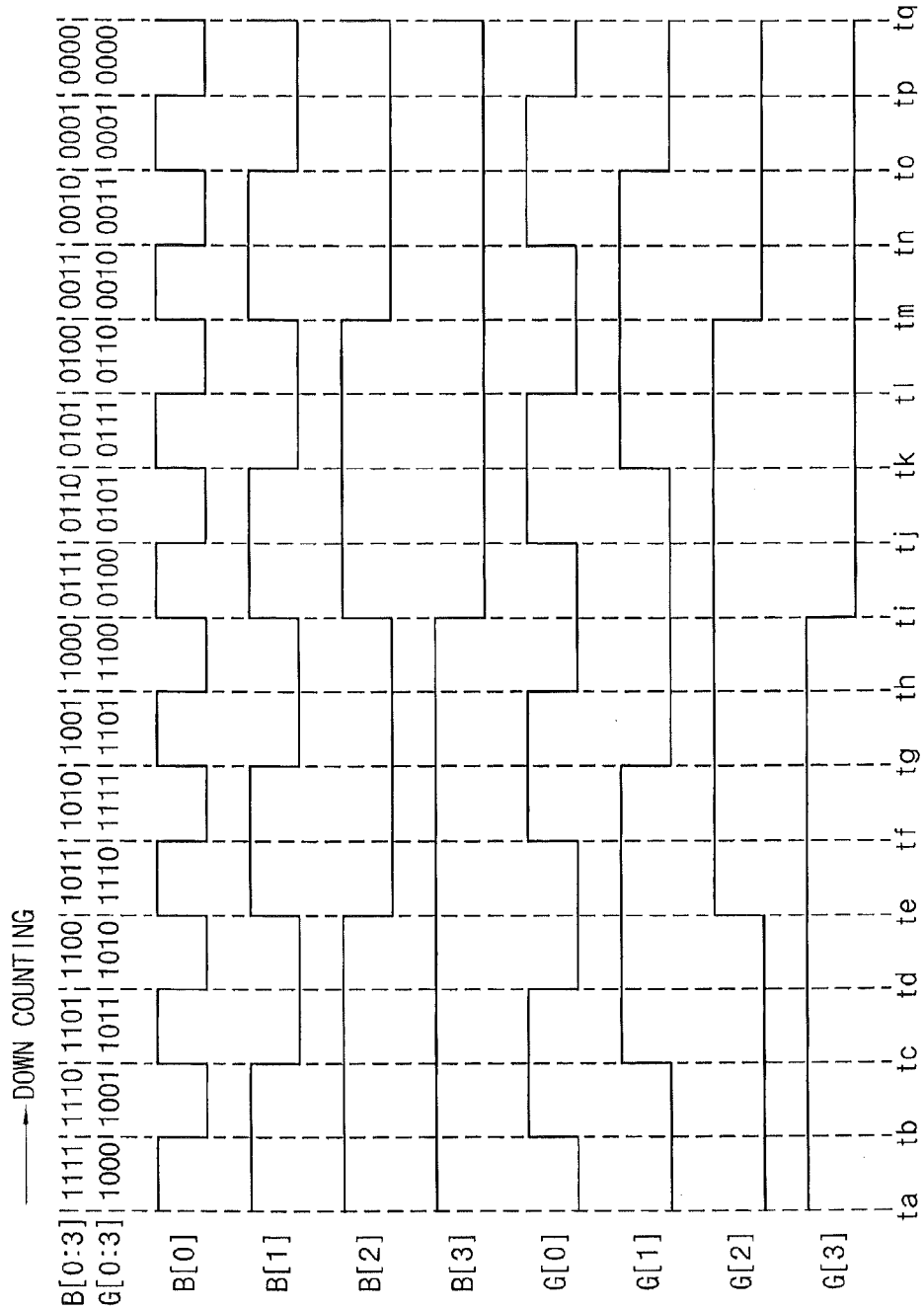

In an upper end portion of FIG. 8, the values of the binary code B[0:3] and the Gray code G[0:3] at each end time point of the counting operation according to elapse of time are denoted, in which the binary code B[0:3] is decreased as to "1111, 1110, 1101, 1100, . . . " and the Gray code G[0:3] is decreased as to "1000, 1001, 1011, 1010, . . . ", so it may be recognized that the down-counting operation is performed.

The binary-to-Gray conversion circuit according to example embodiments may be implemented with the (n−1) inverters and the n negative-edge triggered flip-flops to convert an n-bit binary code, which is down-counted, into an n-bit Gray code which is down-counted.

FIG. 10 is a block diagram illustrating a Gray code counter including a binary-to-Gray converting circuit according to example embodiments.

Referring to FIG. 10, a Gray code counter 200 includes a binary counter circuit 220 and a binary-to-Gray converting circuit 100.

The binary counter circuit 220 generates a binary code B[0:(n−1)] of n bits, where n is a natural number equal to or greater than two, based on a power supply voltage VDD and a clock signal CLK. The binary code B[0:(n−1)] includes a first binary bit signal B[0] through an $n^{th}$ binary bit signal B[n−1] which are sequentially toggled. For example, the binary counter circuit 220 may be a synchronous counter circuit or an asynchronous counter circuit (for example, a ripple counter circuit), and may include a first flip-flop through an $n^{th}$ flip-flop that are cascade-connected to generate the first through $n^{th}$ binary bit signals. Further, the binary counter circuit 220 may perform an up-counting operation or a down-counting operation. A detailed configuration of the binary counter circuit 220 will be described below with reference to FIGS. 11, 12 and 13.

The binary-to-Gray converting circuit 100 generates a Gray code G[0:(n−1)] of n bits based on the binary code B[0:(n−1)] and the power supply voltage VDD. As described above with reference to FIG. 1, the binary-to-Gray converting circuit 100 includes a buffer unit 120 and a conversion unit 140. The buffer unit 120 generates a data code D[0:(n−1)] of n bits in response to the power supply voltage VDD and a second binary bit signal B[1] through an $n^{th}$ binary bit signal B[n−1] except for a first binary bit signal B[0] corresponding to the LSB of the binary code B[0:(n−1)]. The conversion unit 140 generates the Gray code G[0:(n−1)] based on the binary code B[0:(n−1)] and the data code D[0:(n−1)], and generates a $k^{th}$ Gray bit signal, where k is a natural number equal to or greater than one and equal to or less than n, by latching a $k^{th}$ data bit signal in response to a $k^{th}$ binary bit signal. A logic level of the $k^{th}$ Gray bit signal is determined corresponding to a logic level of the $k^{th}$ data bit signal. Since the binary-to-Gray converting circuit 100 includes the plurality of flip-flops without using a plurality of XOR gates, the binary-to-Gray converting circuit 100 may effectively generate a glitch-free Gray code G[0:(n−1)] without increasing the size thereof. Further, since the binary-to-Gray converting circuit 100 may use a relatively low driving frequency, the Gray code counter 200 including the binary-to-Gray converting circuit 100 may easily perform the timing control while reducing the power consumption.

In an example embodiment, when the binary counter circuit 220 performs an up-counting operation, the binary-to-Gray converting circuit 100 may be implemented with the (n−1) inverts and the n positive-edge triggered flip-flops, as described above with reference to FIG. 2. In another example embodiment, when the binary counter circuit 220 performs the down-counting operation, the binary-to-Gray converting circuit 100 may be implemented with the (n−1) inverts and the n negative-edge triggered flip-flops, as described above with reference to FIG. 7.

The Gray code counter 200 may further receive a counting end signal representing the end point of the counting operation. The Gray code counter 200 may latch the logic levels of the first Gray bit signal G[0] to the $n^{th}$ Gray bit signal G[n−1] based on the counting end signal at the end point of the counting operation to provide the value corresponding to the counting result.

Figure 11:
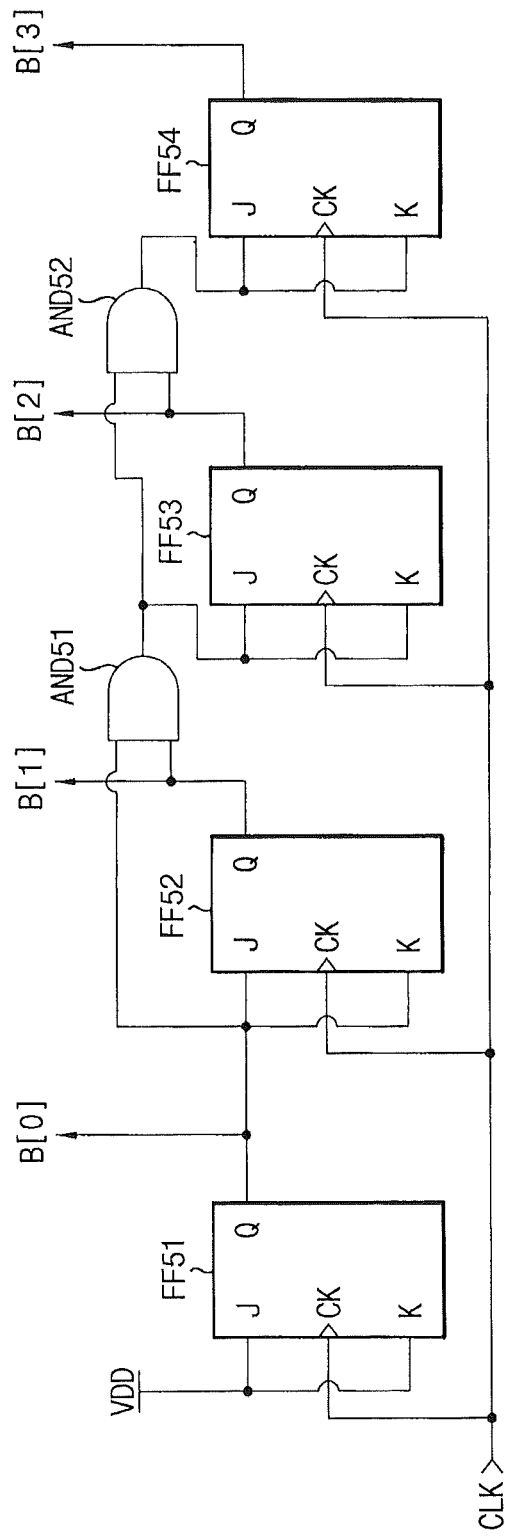
FIGS. 11, 12 and 13 are block diagrams illustrating examples of the binary counter circuit included in the Gray code counter of FIG. 10.
Figure 12:
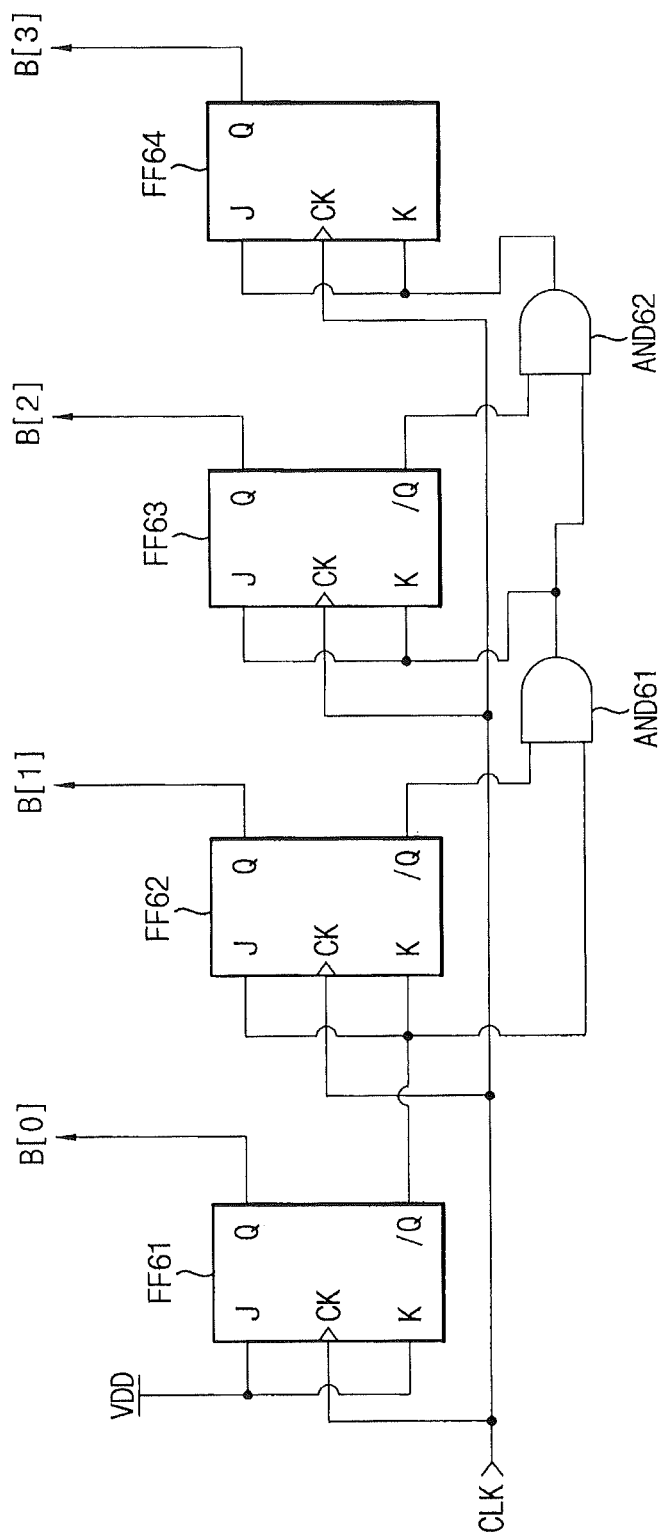
Figure 13:
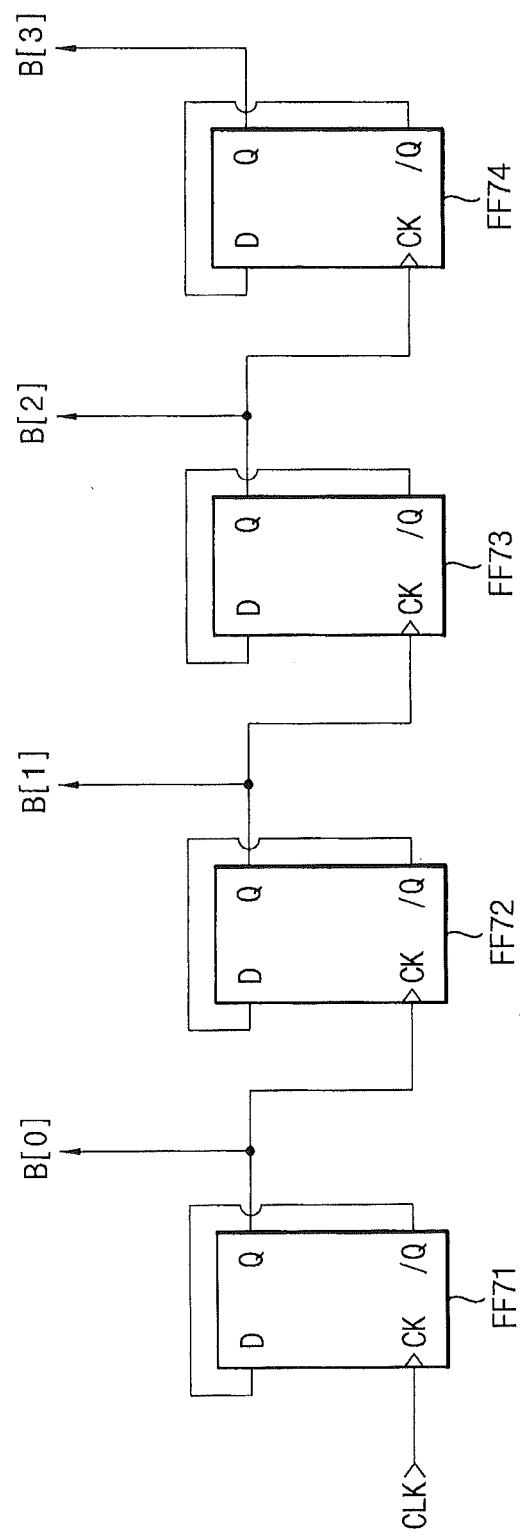

FIGS. 11, 12 and 13 are block diagrams illustrating examples of the binary counter circuit included in the Gray code counter of FIG. 10.

Hereinafter, for the purpose of convenience of explanation and without limitation, the configurations of binary counter circuits 220a, 220b and 220c will be described using a 4-bit digital signal B[0], B[1], B[2] and B[3], e.g., a 4-bit binary code B[0:3] is generated by each of the binary counter circuits 220a, 220b and 220c.

Referring to FIG. 11, the binary counter circuit 220a may be a synchronous counter circuit, and may include AND gates AND51 and AND52 and flip-flops FF51, FF52, FF53 and FF54 which are cascade-connected.

Each of the flip-flops FF51, FF52, FF53 and FF54 may include a clock input terminal CK to which a clock signal CLK is applied. The first flip-flop FF51 may include data input terminals J and K to which the power supply voltage VDD is applied and a data output terminal Q through which the first binary bit signal B[0] is output. The second flip-flop FF52 may include data input terminals J and K which are connected to the data output terminal Q of the first flip-flop FF51 and a data output terminal Q through which the second binary bit signal B[1] is output. The first AND gate AND51 may perform the AND operation of the first binary bit signal B[0] and the second binary bit signal B[1]. The third flip-flop FF53 may include data input terminals J and K which are connected to the data output terminal Q of the first AND gate AND51 and a data output terminal Q through which the third binary bit signal B[2] is output. The second AND gate AND52 may perform the AND operation of the output signal of the first AND gate AND 51 and the third binary bit signal B[2]. The fourth flip-flop FF54 may include data input terminals J and K which are connected to the data output terminal Q of the second AND gate AND52 and a data output terminal Q through which the fourth binary bit signal B[3] is output.

The binary counter circuit 220a of FIG. 11 may perform an up-counting operation. When the binary counter circuit 220 of FIG. 10 is implemented with the binary counter circuit 220a of FIG. 11, the binary-to-Gray converting circuit 100 of FIG. 10 may be implemented with the binary-to-Gray converting circuit 100a of FIG. 2 and may operate as described with reference to FIGS. 3, 4A, 4B, 4C and 4D.

Referring to FIG. 12, the binary counter circuit 220b may be a synchronous counter circuit, and may include AND gates AND61 and AND62 and flip-flops FF61, FF62, FF63 and FF64 which are cascade-connected.

Each of the flip-flops FF61, FF62, FF63 and FF64 may include a clock input terminal CK to which a clock signal CLK is applied. The first flip-flop FF61 may include data input terminals J and K to which the power supply voltage VDD is applied, a data output terminal Q through which the first binary bit signal B[0] is output, and an inverted data output terminal /Q. The second flip-flop FF62 may include data input terminals J and K which are connected to the inverted data output terminal /Q of the first flip-flop FF61, a data output terminal Q through which the second binary bit signal B[1] is output, and an inverted data output terminal /Q. The first AND gate AND61 may perform the AND operation of the inverted signal of the first binary bit signal B[0] and the inverted signal of the second binary bit signal B[1]. The third flip-flop FF63 may include data input terminals J and K which are connected to the output terminal Q of the first AND gate AND61, a data output terminal Q through which the third binary bit signal B[2] is output, and an inverted data output terminal /Q. The second AND gate AND62 may perform the AND operation of the output signal of the first AND gate AND61 and the inverted signal of the third binary bit signal B[2]. The forth flip-flop FF64 may include data input terminals J and K which are connected to the output terminal Q of the second AND gate AND62, and a data output terminal Q through which the fourth binary bit signal B[3] is output.

The binary counter circuit 220b of FIG. 12 may perform a down-counting operation. When the binary counter circuit 220 of FIG. 10 is implemented with the binary counter circuit 220b of FIG. 12, the binary-to-Gray converting circuit 100 of FIG. 10 may be implemented with the binary-to-Gray converting circuit 100d of FIG. 7 and may operate as described above with reference to FIGS. 8, 9A, 9B, 9C and 9D.

Referring to FIG. 13, the binary counter circuit 220c may be a ripple counter circuit which is one example of an asynchronous counter circuit, and may include flip-flops FF71, FF72, FF73 and FF74 which are cascade-connected.

Each of the flip-flops FF71, FF72, FF73 and FF74 may include a data input terminal D connected to an inverted data output terminal /Q and a data output terminal Q through which one of the first to fourth binary bit signals B[0], B[1], B[2] and B[3] is output. For example, the first flip-flop FF71 may include the data input terminal D connected to the inverted data output terminal /Q of the first flip-flop FF71 and the data output terminal Q through which the first binary bit signal B[0] is output. The first flip-flop FF71 may include a clock input terminal CK to which a clock signal CLK is applied. The second through fourth flip-flops FF72, FF73 and FF74 may include clock input terminals CK connected to the data output terminals Q of the previous flip-flops. For example, the clock terminal CK of the second flip-flop FF72 may be connected to the data output terminal Q of the first flip-flop FF71.

In another example embodiment, the flip-flops FF71, FF72, FF73, and FF74 may be a positive-edge triggered flip-flop. In this case, the binary counter circuit 220*c* may perform an down-counting operation, and, when the binary counter circuit 220 of FIG. 10 is the binary counter circuit 220*c* of FIG. 13 which is implemented with the positive-edge triggered flip-flop, the binary-to-Gray converting circuit 100 of FIG. 10 may be implemented with the binary-to-Gray converting circuit 100*d* of FIG. 7.

In an example embodiment, the flip-flops FF71, FF72, FF73, and FF74 may be a negative-edge triggered flip-flop. In this case, the binary counter circuit 220*c* may perform an up-counting operation, and, when the binary counter circuit 220 of FIG. 10 is the binary counter circuit 220*c* of FIG. 13 which is implemented with the negative-edge triggered flip-flop, the binary-to-Gray converting circuit 100 of FIG. 10 may be implemented with the binary-to-Gray converting circuit 100*a* of FIG. 2.

According to example embodiment, the binary counter circuit (e.g., 220 of FIG. 10) may be variously modified from the configurations illustrated in FIGS. 11, 12 and 13 to perform the up-counting operation or the down-counting operation.

Figure 14:
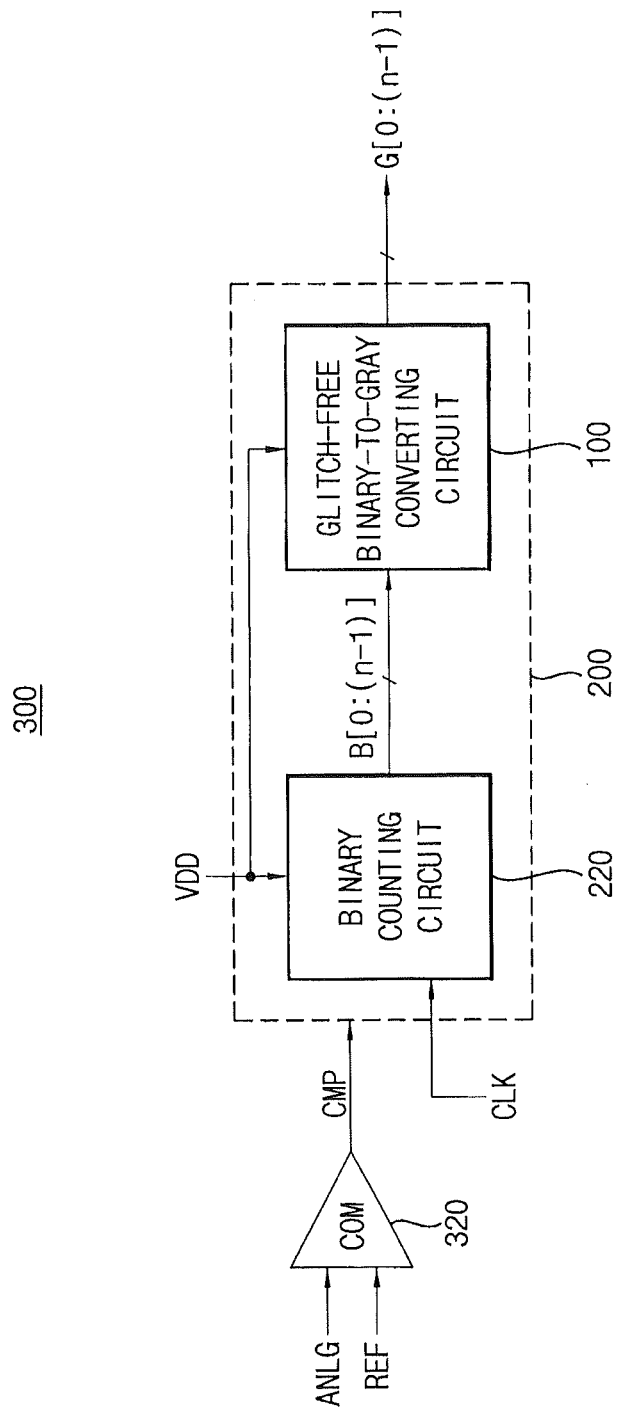
FIG. 14 is a block diagram illustrating an analog-to-digital converter including a Gray code counter according to example embodiments.

FIG. 14 is a block diagram illustrating an analog-to-digital converter including a Gray code counter according to example embodiments.

Referring to FIG. 14, an analog-to-digital converter 300 include a comparator 320 and a Gray code counter 200.

The comparator 320 compares an input analog signal ANLG with a reference signal REF to generate a comparison signal CMP. The analog signal ANLG may represent a predetermined effective physical quantity such as an intensity of light, an intensity of sound, and time. For example, the physical quantity may correspond to a voltage level of the analog signal ANLG. In this case, to compare the analog signal ANLG with a reference signal REF, the reference signal REF may have a predetermined gradient and may serve as a rising or falling ramp signal. The comparator 320 may compare the voltage level of the analog signal ANLG with the reference signal, REF e.g., the voltage level of the ramp signal, to generate the comparison signal CMP which is transitioned at the time point when the voltage levels are equal to each other. As a result, the physical quantity denoted as the voltage level of the analog signal ANLG is expressed as a transition time point, e.g., time quantity. For example, the time point at which the comparison signal CMP is transitioned into a logic low may denote an end point of a counting operation, and the comparison signal CMP may be used as a counting end signal in the Gray code counter 200.

The Gray code counter 200 may perform a counting operation based on the clock signal CLK and the power supply voltage VDD to generate a Gray code G[0:(n−1)] of n bits, and may latch a logic level of the Gray code G[0:(n−1)] at the end point of the counting operation based on the comparison signal CMP, such that a value corresponding to the counting result may be provided. As described above with reference to FIG. 10, the Gray code counter 200 includes a binary counter circuit 220 and a binary-to-Gray converting circuit 100. The binary counter circuit 220 generates a binary code B[0:(n−1)] of n bits based on the power supply voltage VDD and the clock signal CLK. Since the binary-to-Gray converting circuit 100 generates the Gray code G[0:(n−1)] based on the binary code B[0:(n−1)] and the power supply voltage VDD, and, as described above with reference to FIG. 1, is implemented with the plurality of flip-flops without using a plurality of XOR gates, the binary-to-Gray converting circuit 100 may effectively generate a glitch-free Gray code G[0:(n−1)] without increasing the size thereof.

As described above with reference to FIGS. 1 through 13, the Gray code counter 200 may be variously modified for performing the up-counting operation or the down-counting operation.

Figure 15:
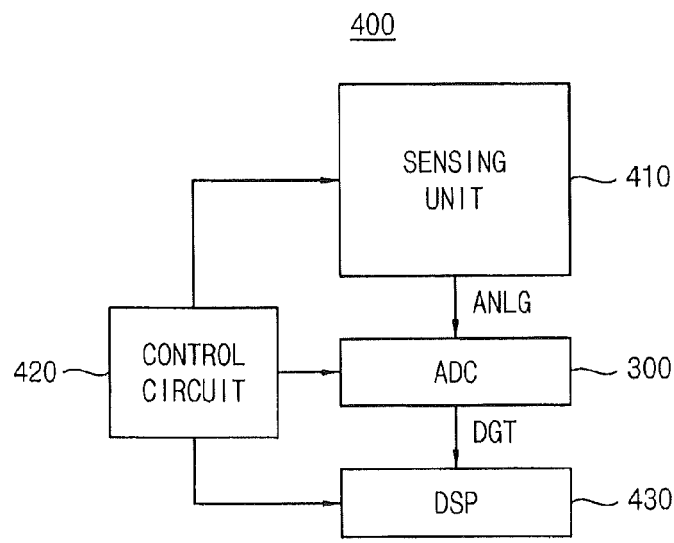
FIG. 15 is a block diagram illustrating an apparatus including an analog-to-digital converter according to the example embodiments.

FIG. 15 is a block diagram illustrating an apparatus including an analog-to-digital converter according to example embodiments.

Referring to FIG. 15, the apparatus 400 includes a sensing unit 410, an analog-to-digital converter 300 and a control circuit 420.

The sensing unit 410 senses a physical amount to generate an analog signal ANLG corresponding to the physical amount. The analog-to-digital converter 300 compares the analog signal ANLG with a reference signal using at least one Gray code counter to generate a digital signal DGT corresponding to the analog signal ANLL. The control circuit 420 controls operation timings of the sensing unit 410 and the analog-to-digital converter 300.

As described above with reference to FIG. 14, the analog-to-digital converter 300 performs a data converting operation using the Gray code counter (200 of FIG. 10) including the binary-to-Gray converting circuit (100 of FIG. 1) according to the example embodiment. Since the binary-to-Gray converting circuit 100 generates the Gray code G[0:(n−1)] of n bits based on the binary code B[0:(n−1)] and the power supply voltage VDD, and is implemented with the plurality of flip-flops without using a plurality of XOR gates, the binary-to-Gray converting circuit 100 may effectively generate a glitch-free Gray code G[0:(n−1)] without increasing the size thereof.

The sensing unit 410 senses a predetermined effective physical quantity, such as an intensity of light, an intensity of sound, and time, to convert the physical quantity into an analog signal ANLG, which is an electrical signal, and to output the analog signal ANLG. The apparatus 400 including the sensing unit 410 may include various electronic devices and systems, such as an image sensor including a CCD (Charge Coupled Device) image sensor and a CMOS (Complementary Metal Oxide Semiconductor) image sensor, a digital camera including the image sensor, or an acoustimeter, or a computer system. According to the example embodiments, the apparatus 400 may further include a DSP (Digital Signal Processor) 430 for receiving and processing a digital signal DGT, in which the DSP 430 may be implemented in an inside or an outside of the apparatus 400.

Hereinafter, an image sensor and a correlated double sampling method among various electronic devices, which may be implemented with a Gray code counter according to the example embodiments, will be described in more detail.

Figure 16:
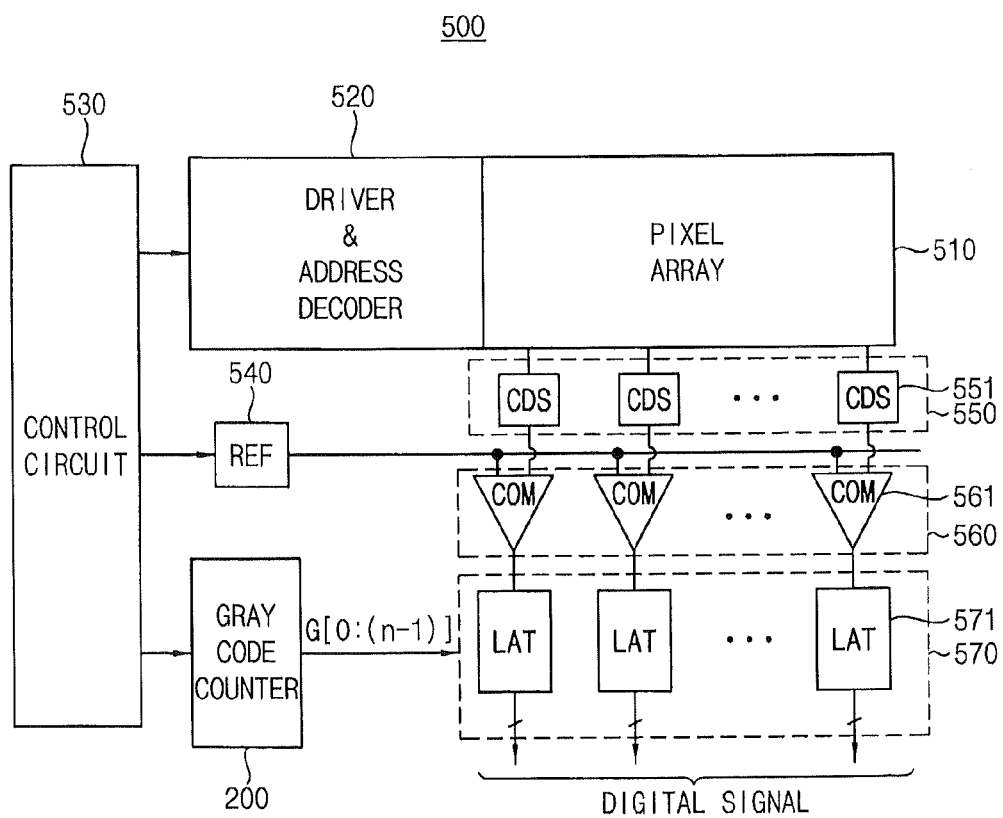
FIGS. 16 and 17 are block diagrams illustrating image sensors commonly including a Gray code counter according to example embodiment.
Figure 17:
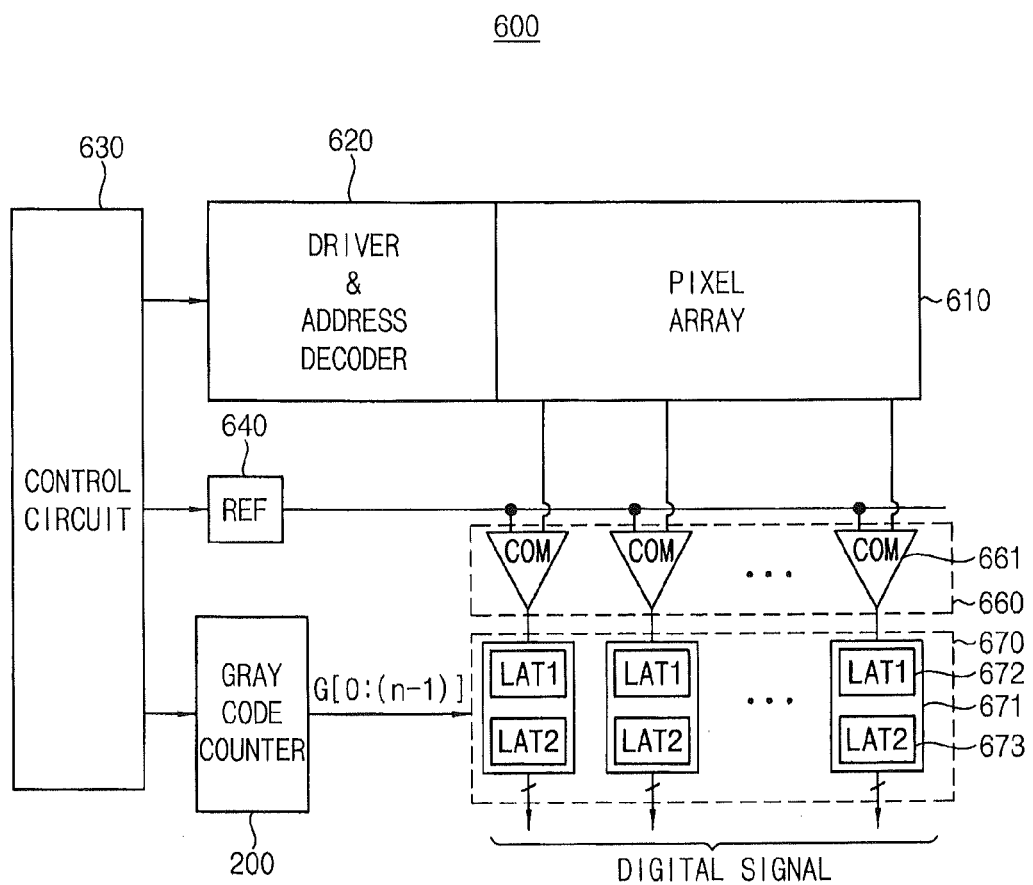

FIGS. 16 and 17 are block diagrams illustrating image sensors commonly including a Gray code counter according to example embodiment.

Referring to FIG. 16, the image sensor 500 may include a pixel array 510, a driver/address decoder 520, a control circuit 530, a reference signal generator 540, a correlated double sampling unit 550, a comparing unit 560, a Gray code counter 200, and a latching unit 570.

In the field of display devices, a CCD or CMOS image sensor for sensing incident light as a physical quantity is used as an imaging device, and the image sensor 500 of FIG. 16 may be the CCD image sensor or the CMOS image sensor.

According to one example of the image sensor, the pixel array 510 includes a plurality of arrayed pixels for converting the incident light into an electrical analog signal through a unit component (for example, a unit pixel). In an image sensor called an APS (Active Pixel Sensor) or a gain cell, a signal is read from each of unit pixels which are arbitrarily selected by address-controlling a pixel portion including an array of unit pixels. The APS may be one example of an address-controllable imaging device, and the driver/address decoder 520 is provided for controlling an operation of the pixel array in the units of columns and/or rows. The control circuit 530 generates control signals for controlling operation timings of each component of the image sensor 500.

An analog pixel signal read from the pixel array 510 is converted into a digital signal by an analog-to-digital converter implemented with the comparing unit 560, the latching unit 570 and the Gray code counter 200. The pixel signal is generally output and processed in the units of columns. To this end, the correlated double sampling unit 550, the comparing unit 560 and the latching unit 571 may include a plurality of CDS circuits 551, a plurality of comparators 561 and a plurality of latches 571, each of which are configured in the units of columns, respectively.

Since the analog signal output from the pixel array 510 has a deviation due to differences between unique features, such as a FPN (Fixed Pattern Noise) of each pixel, and/or a deviation due to differences in feature between logics for outputting voltage signals from the pixels, there is a need to extract a valid signal component by taking a difference between a signal voltage due to a reset component and a signal voltage due to a signal component. The CDS (Correlated Double Sampling) refers to the sampling method to extract the valid signal component based on a difference between the reset component and the signal component (that is, an image signal component) obtained when a pixel is reset.

The CDS unit 550 obtains the difference between the analog voltages which denote the reset component using a capacitor and a switch and the signal component sensed through a photodiode to perform an ADS (Analog Double Sampling), and outputs an analog voltage corresponding to the valid signal component. The comparing unit 560 compares the analog voltage output from the CDS unit 550 in the units of columns with the ramp signal generated from the reference signal generator 540 to output comparison signals having each transition time point according to the valid signal component in the units of columns. The first to $n^{th}$ Gray bit signals, which are included in the n-bit Gray code G[0:(n−1)] output from the Gray code counter 200, are commonly provided to each latch 571, and the latching unit 570 latches the Gray bit signals output from the Gray code counter 200 in response to the transition time points of each comparison signal to output the latched digital signal by units of columns.

The Gray code counter 200 includes the binary-to-Gray converting circuit (100 of FIG. 1) according to the example embodiment. The binary-to-Gray converting circuit 100 may generate the Gray code G[0:(n−1)] based on a binary code and a power supply voltage and may effectively generate the glitch-free Gray code G[0:(n−1)] without increasing the size thereof since the binary-to-Gray converting circuit 100 is implemented without a plurality of XOR gates.

Although it is described with reference to FIG. 16 that the Gray code counter 200 according to the example embodiments is used for the image sensor 500 to perform the analog double sampling, as described below with reference to FIGS. 17 and 18, the Gray code counter 200 may be also used for an image sensor which performs a DDS (Digital Double Sampling). The DDS extracts a valid signal component based on a difference between two digital signals after converting analog signals of reset and signal components into the two digital signals when a pixel is reset.

Referring to FIG. 17, the image sensor 600 may include a pixel array 610, a driver/address decoder 620, a control circuit 630, a reference signal generator 640, a comparing unit 660, a Gray code counter 200, and a latching unit 670.

As compared with the image sensor 500, the image sensor 600 of FIG. 17 has a configuration for performing the DDS. Each latch 671 configured in the units of columns includes a first latch 672 and a second latch 673. The pixel array 610 sequentially outputs a first analog signal representing a reset component for a correlated double sampling and a second analog signal representing an image signal component. In a first sampling procedure, the comparing unit 660 compares a first analog voltage representing the reset component with a ramp signal generated from the reference signal generator 640 to output comparison signals having each transition time point according to the reset component in the units of columns. The first to $n^{th}$ Gray bit signals, which are included in the n-bit Gray code G[0:(n−1)] output from the Gray code counter 200, are commonly provided each latch 671, and each latch 671 stores the Gray bit signals output from the Gray code counter 200 and the digital signal for the reset component in the first latch 672 in response to the transition time points of each comparison signal.

In a second sampling procedure, the comparing unit 660 compares a second analog voltage representing the image signal component with the ramp signal generated from the reference signal generator 640 to output comparison signals having transition time points according to the image signal component in the units of columns. The latching unit 670 latches the Gray bit signals output from the Gray code counter 200 in the transition time points of each comparison signal, and stores the digital signal for the image signal component in the second latch 673. The digital signals stored in the first and second latches 672 and 673 are provided to an internal circuit for performing a logic operation, and values representing valid image signal components are computed, such that the digital double sampling may be performed.

Due to the binary-to-Gray converting circuit (100 of FIG. 1) according to the example embodiments, the Gray code counter 200 may effectively generate the glitch-free Gray code G[0:(n−1)] without increasing the size thereof.

Although the image sensors 500 and 600, which perform the correlated double sampling by using the common Gray code counter, have been described with reference to FIGS. 16 and 17, the image sensors may be implemented with a plurality of Gray code counters configured for a high-speed operation in the units of columns. Hereinafter, an image sensor including the plurality of Gray code counters configured in the units of columns will be described.

Figure 18:
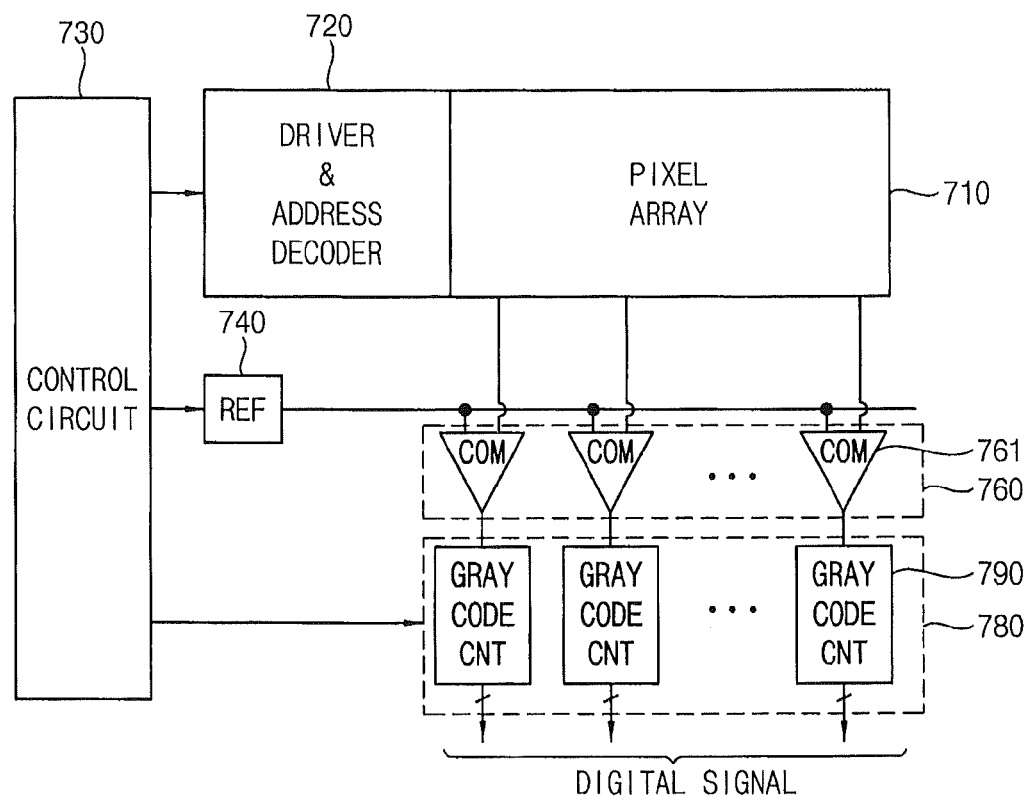
FIG. 18 is a block diagram illustrating an image sensor including a plurality of Gray code counters according to example embodiments.

FIG. 18 is a block diagram illustrating an image sensor including a plurality of Gray code counters according to the example embodiments.

Referring to FIG. 18, the image sensor 700 may include a pixel array 710, a driver/address decoder 720, a control circuit 730, a reference signal generator 740, a comparing unit 760, and a counting block 780.

The pixel array 710 includes a plurality of pixels arranged for converting incident light into an electrical analog signal through a unit component (for example, unit pixel) and outputting the electrical analog signal. The driver/address decoder 720 is provided for controlling an operation of a pixel array in the units of columns or rows. The control circuit 730 generates a control signal for controlling operation timings of each component of the image sensor 700.

An analog pixel signal read from the pixel array 710 is converted into a digital signal by an analog-to-digital converter including the comparing unit 760 and the counting block 780. In order to output and process the pixel signal in the units of columns, the comparing unit 760 and the counting block 780 may include a plurality of comparators 761 configured in the units of columns and a plurality of Gray code counters 790, respectively. By simultaneously and parallel processing pixel signals of one row using a plurality of signal processing units configured in the units of columns, the image sensor 700 has an improved performance.

The pixel array 710 sequentially outputs a first analog signal representing a reset component for a correlated double sampling and a second analog signal representing an image signal component, and the analog-to-digital converter, which is implemented with the comparing unit 760 and the counting block 780, digitally performs the correlated double sampling that is, the digital double sampling based on the first and second analog signals.

Figure 19:
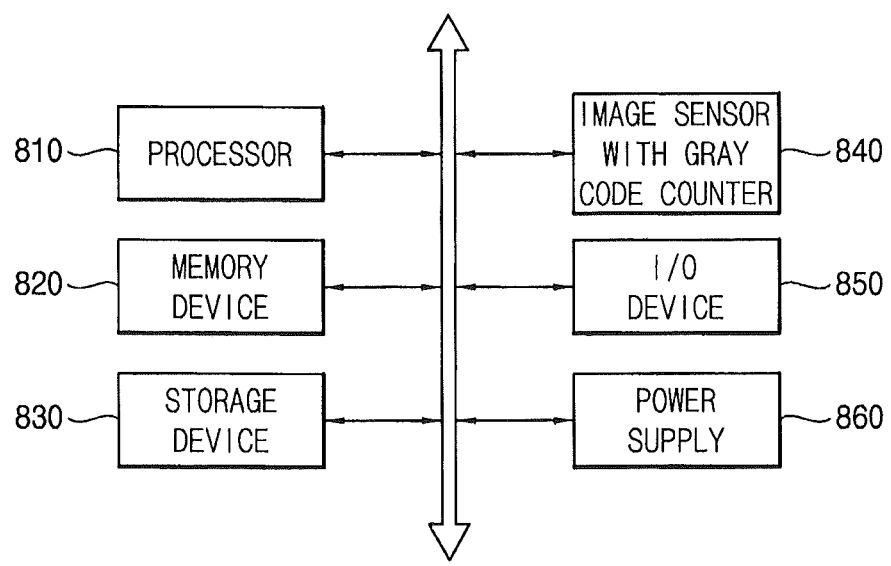
FIG. 19 is a block diagram illustrating an example of application in which the image sensor according to the example embodiments is applied to a computing system.

FIG. 19 is a block diagram illustrating an example of applying the image sensor according to the example embodiments to a computing system.

Referring to FIG. 19, the computing system 800 may include a processor 810, a memory device 820, a storage device 830, an image sensor 840, an input/output device 850 and a power supply 860. Meanwhile, although not depicted in FIG. 19, the computing system 800 may further include ports which may communicate with a video card, a sound card, a memory card and a USB device, or any electronic systems.

The processor 810 may perform specific calculations or tasks. According to example embodiments, the processor 810 may be a microprocessor or a CPU (Central Processing Unit). The processor 810 may be connected to and communicate with the memory device 820, the storage device 830 and the input/output device 850 through an address bus, a control bus and a data bus. According to example embodiments, the processor 810 may be connected to a extended bus such as a PCI (Peripheral Component Interconnect).

The memory device 820 may store data required to perform an operation of the computing system 800. For example, the memory device 820 may include a volatile memory device such as a DRAM (Dynamic Random Access Memory) and a SRAM (Static Random Access Memory), and a nonvolatile memory device such as an EPROM (Erasable Programmable Read-Only Memory), an EEPROM (Electrically Erasable Programmable Read-Only Memory) and a flash memory device.

The memory device 820 may include a solid state drive, a hard disk drive and a CD-ROM. The input/output device 850 may include an input unit such as a keyboard, a keypad, a mouse and the like, and an output unit such as a printer, a display and the like. The power supply 860 may provide an operational voltage for operating the computing system 800.

The image sensor 840 may be connected to and communicate with the processor 810 through the buses or another communication link. The image sensor 840 may be one of the image sensors 500, 600 and 700 of FIGS. 16 to 18, and may include at least one Gray code counter 200 described above with reference to FIG. 10. That is, by including the binary-to-Gray converting circuit (100 of FIG. 1) according to the example embodiments, the Gray code counter of the image sensor 840 may effectively generate the glitch-free Gray code without increasing the size thereof.

The image sensor 840 may be implemented in various forms of a package. For example, at least one part of a configuration of the image sensor 840 may be mounted by using a package, such as PoP (Package on Package), BGAs (Ball grid arrays), CSPs (Chip scale packages), PLCC (Plastic Leaded Chip Carrier), PDIP (Plastic Dual In-Line Package), a die in waffle pack, COB (Die in Wafer Form, Chip On Board), CERDIP (Ceramic Dual In-Line Package), MQFP (Plastic Metric Quad Flat Pack), TQFP (Thin Quad Flatpack), SOIC (Small Outline), SSOP (Shrink Small Outline Package), TSOP (Thin Small Outline), TQFP (Thin Quad Flatpack), SIP (System In Package), MCP (Multi Chip Package), WFP (Wafer-level Fabricated Package), and WSP (Wafer-Level Processed Stack Package).

According to the example embodiments, the image sensor 840 may be integrated in one chip together with the processor 810, or may be separately integrated in different chips. Meanwhile, it should be understood that the computing system 800 is an arbitrary computing system using an image sensor. For example, the computing system 800 may include a digital camera, a mobile phone, a PDA (Personal Digital Assistants), a PMP (Portable Multimedia Player), and a smart phone.

FIG. 20 is a block diagram illustrating one example of an interface used in the computing system of FIG. 19.

Referring to FIG. 20, the computing system 1000 may be implemented with a data processing apparatus (for example, a mobile phone, PDA (Personal Digital Assistants) and a PMP (Portable Multimedia Player) and a smart phone), and may include an application processor 1110, an image sensor 1140 and a display 1150.

A CSI (Camera Serial Interface) host 1112 of the application processor 1110 may perform a serial communication with a CSI device 1141 of an image sensor 1140 through a CSI. In example embodiments, the CSI host 1112 may include an optical DES (Deserializer), and may include an optical SER (serializer). A DSI (Display Serial Interface) host 1111 of the application processor 1110 may perform serial communication with a DSI device 1151 of the display 1150 through a DSI. In example embodiments, the DSI host 1111 may include an optical SER, and the DSI device 1151 may include an optical DSE.

Further, the computing system 1000 may further include an RF (Radio Frequency) chip 1160 which can communicate with the application processor 1110. A PHY 1113 of the computing system 1000 and a PHY 1161 of the RF chip 1160 may perform data transmission/reception according to a MIPI (Mobile Industry Processor Interface) DigRF. Further, the application processor 1110 may further include a DigRF MASTER 1114 which controls the data transmission/reception according to the MIPI DigRF of the PHY 1161, and the RF chip 1160 may further include a DigRF SLAVE 1162 which is controlled through the DigRF MASTER 1114.

Meanwhile, the computing system 1000 may include a GPS (Global Positioning System) 1120, storage 1170, a microphone 1180, a DRAM (Dynamic Random Access Memory) 1185 and a speaker 1190. Further, the computing system 1000 may perform communication using UWB (Ultra Wide Band) 1210, WLAN (Wireless Local Area Network) 1220 and WIMAX (Worldwide Interoperability for Microwave Access) 1230. However, the structure and interface of the computing system 1000 are examples and not limited.

The example embodiments may be utilized for a Gray code counter and an analog-to-digital converter including a binary-to-Gray converting circuit, and an electronic device including them, and may be applied to a computer, a digital camera, a 3D camera, a mobile phone, a PDA, a scanner, a navigation apparatus for a vehicle, a video phone, a monitoring system, an auto-focus system, a tracking system, a movement sensing system, an image stabilizing system, etc.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A binary-to-Gray converting circuit, comprising:
a buffer unit configured to generate a data code of n bits, where n is a natural number equal to or greater than two, in response to a power supply voltage and a second binary bit signal through an $n^{th}$ binary bit signal except for a first binary bit signal, the first binary bit signal corresponding to a least significant bit of a binary code of n bits, the second through $n^{th}$ binary bit signals corresponding to other bits of the binary code; and
a conversion unit configured to generate a Gray code of n bits based on the binary code and the data code, and configured to generate a $k^{th}$ Gray bit signal, where k is a natural number equal to or greater than one and equal to or less than n, by latching a $k^{th}$ data bit signal in response to a $k^{th}$ binary bit signal, a logic level of the $k^{th}$ Gray bit signal being determined corresponding to a logic level of the $k^{th}$ data bit signal, the $k^{th}$ Gray bit signal corresponding to a $k^{th}$ bit of the Gray code, the $k^{th}$ data bit signal corresponding to a $k^{th}$ bit of the data code, and the $k^{th}$ binary bit signal corresponding to a $k^{th}$ bit of the binary code.

2. The binary-to-Gray converting circuit of claim 1, wherein the conversion unit includes a first flip-flop through an $n^{th}$ flip-flop, each of the first through $n^{th}$ flip-flops generates one of a first Gray bit signal through an $n^{th}$ Gray bit signal corresponding to a respective one of a first bit through an $n^{th}$ bit of the Gray code.

3. The binary-to-Gray converting circuit of claim 2, wherein each of the first through $n^{th}$ flip-flops includes:
a data input terminal configured to receive one of a first data bit signal through an $n^{th}$ data bit signal corresponding to a respective one of a first bit through an $n^{th}$ bit of the data code;
a clock input terminal configured to receive a respective one of the first through $n^{th}$ binary bit signals; and
a data output terminal configured to output a respective one of the first through $n^{th}$ Gray bit signals.

4. The binary-to-Gray converting circuit of claim 3, wherein the buffer unit includes a first inverter through an $(n-1)^{th}$ inverter, each of the first through $(n-1)^{th}$ inverters generates a respective one of the first through $(n-1)^{th}$ data bit signals.

5. The binary-to-Gray converting circuit of claim 4, wherein an $m^{th}$ inverter, where m is a natural number equal to or greater than one and equal to or less than $(n-1)$, inverts an $(m+1)^{th}$ binary bit signal to generate an $m^{th}$ data bit signal.

6. The binary-to-Gray converting circuit of claim 5, wherein the buffer unit outputs the power supply voltage as the $n^{th}$ data bit signal.

7. The binary-to-Gray converting circuit of claim 6, wherein each of the first through $n^{th}$ flip-flops is a positive-edge triggered D flip-flop operating in response to a rising edge of the respective one of the first through $n^{th}$ binary bit signals.

8. The binary-to-Gray converting circuit of claim 2, wherein each of the first through $n^{th}$ flip-flops includes:
a data input terminal configured to receive one of a first data bit signal through an $n^{th}$ data bit signal corresponding to a respective one of a first bit through an $n^{th}$ bit of the data code;
a clock input terminal configured to receive an inversion signal of a respective one of the first through $n^{th}$ binary bit signals; and
an inverted-data output terminal configured to output a respective one of the first through $n^{th}$ Gray bit signals.

9. The binary-to-Gray converting circuit of claim 8, wherein the buffer unit includes a first inverter through an $(n-1)^{th}$ inverter, each of the first through $(n-1)^{th}$ inverters generates a respective one of the first through $(n-1)^{th}$ data bit signals,
wherein an $m^{th}$ inverter, where m is a natural number equal to or greater than one and equal to or less than $(n-1)$, inverts an $(m+1)^{th}$ binary bit signal to generate an $m^{th}$ data bit, and the buffer unit outputs the power supply voltage as the $n^{th}$ data bit signal.

10. The binary-to-Gray converting circuit of claim 9, wherein each of the first through $n^{th}$ flip-flops is a negative-edge triggered D flip-flop operating in response to a falling edge of the respective one of the first through $n^{th}$ binary bit signals.

11. A Gray code counter, comprising:
a binary counter circuit configured to generate a binary code of n bits, where n is a natural number equal to or greater than two, based on a power supply voltage and a clock signal; and
a binary-to-Gray converting circuit configured to generate a Gray code of n bits based on the binary code and the power supply voltage,
wherein the binary-to-Gray converting circuit comprises:
a buffer unit configured to generate a data code of n bits in response to the power supply voltage and a second binary bit signal to an $n^{th}$ binary bit signal except for a first binary bit signal, the first binary bit signal corresponding to a least significant bit of the binary code, the second through $n^{th}$ binary bit signals corresponding to other bits of the binary code, the first through $n^{th}$ binary bit signals being sequentially toggled; and
a conversion unit configured to generate the Gray code based on the binary code and the data code, and configured to generate a $k^{th}$ Gray bit signal, where k is a natural number equal to or greater than one and equal to or less than n, by latching a $k^{th}$ data bit signal in response to a $k^{th}$ binary bit signal of the binary code, a logic level of the $k^{th}$ Gray bit signal being determined corresponding to a logic level of the $k^{th}$ data bit signal, the $k^{th}$ Gray bit signal corresponding to a $k^{th}$ bit of the Gray code, the $k^{th}$ data bit signal corresponding to a $k^{th}$ bit of the data code, and the $k^{th}$ binary bit signal corresponding to a $k^{th}$ bit of the binary code.

12. The Gray code counter of claim 11, wherein the binary counter circuit is a synchronous counter circuit or an asynchronous counter circuit.

13. The Gray code counter of claim 12, wherein the binary counter circuit includes a first flip-flop through an $n^{th}$ flip-flop that are cascade-connected, each of the first through $n^{th}$ flip-flops generate one of the first through $n^{th}$ binary bit signals in response to the clock signal.

14. The Gray code counter of claim 11, wherein the binary counter circuit performs an up-counting operation or a down-counting operation.

15. The Gray code counter of claim 14, wherein the conversion unit includes a first flip-flop through an $n^{th}$ flip-flop, each of the first through $n^{th}$ flip-flops generate one of a first Gray bit signal through an $n^{th}$ Gray bit signal corresponding to a respective one of a first bit through an $n^{th}$ bit of the Gray code, and wherein each of the first through $n^{th}$ flip-flops is a positive-edge triggered D flip-flop operating in response to a rising edge of a respective one of the first through $n^{th}$ binary bit signals when the binary counter circuit performs the up-countering operation, and is a negative-edge triggered D flip-flop operating in response to a falling edge of a respective one of the first through $n^{th}$ binary bit signals when the binary counter circuit performs the down-countering operation.

16. A binary-to-Gray converting circuit, comprising:
a buffer unit configured output a clock signal and a data signal, both based on a bit included in a binary code to be translated to a Gray code by the binary-to-Gray converting circuit; and
a conversion unit, coupled to the buffer unit, configured to receive the clock signal at a clock input terminal of an upper stage of the conversion unit and configured to receive the data signal at a data input terminal of a lower stage of the conversion unit, relative to the upper stage.

17. The circuit of claim 16 wherein the buffer unit further comprises:
an input terminal configured to receive the bit included in the binary code to be translated to a Gray code;
an output terminal, coupled to the input terminal, configured to provide the bit to the clock input terminal of the upper stage of the conversion unit as the clock signal; and
an inverter circuit, coupled to the input terminal, configured to invert the bit to provide the data signal to the lower stage of the conversion unit.

18. The circuit of claim 16 wherein the buffer unit is configured to receive a plurality of parallel bits included in the binary code and is configured to provide a respective plurality of parallel bits included in a data code provided to the conversion unit; and
the conversion unit is configured to receive the respective plurality of parallel bits included in a data code at respective stages of the conversion unit.

19. The circuit of claim 18 wherein an uppermost stage of the conversion unit receives a static power supply voltage signal as an uppermost bit included in the data code.

20. The circuit of claim 18 wherein a lower order bit included in the binary code is provided as a lowest stage clock input to the conversion unit.

* * * * *